(12) United States Patent
Yedinak

(10) Patent No.: US 12,272,747 B2
(45) Date of Patent: Apr. 8, 2025

(54) ELECTRONIC DEVICE INCLUDING A TRANSISTOR STRUCTURE

(71) Applicant: SEMICONDUCTOR COMPONENTS INDUSTRIES, LLC, Phoenix, AZ (US)

(72) Inventor: Joseph Andrew Yedinak, Mountain Top, PA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 427 days.

(21) Appl. No.: 17/643,539

(22) Filed: Dec. 9, 2021

(65) Prior Publication Data
US 2023/0187546 A1 Jun. 15, 2023

(51) Int. Cl.
H01L 29/78 (2006.01)
H01L 21/225 (2006.01)
H01L 29/167 (2006.01)
H01L 29/40 (2006.01)
H01L 29/66 (2006.01)

(52) U.S. Cl.
CPC .... H01L 29/7813 (2013.01); H01L 29/66734 (2013.01); H01L 29/7805 (2013.01); H01L 21/2253 (2013.01); H01L 29/167 (2013.01); H01L 29/407 (2013.01)

(58) Field of Classification Search
None
See application file for complete search history.

(56) References Cited

U.S. PATENT DOCUMENTS

| | | | |
|---|---|---|---|
| 5,929,481 A | 7/1999 | Hshieh et al. | |
| 6,777,747 B2 | 8/2004 | Yedinak et al. | |
| 6,870,220 B2 | 3/2005 | Kocon et al. | |
| 6,916,745 B2 | 7/2005 | Herrick et al. | |
| 7,345,342 B2 | 3/2008 | Challa et al. | |
| 8,013,391 B2 | 9/2011 | Yedinak et al. | |
| 8,227,855 B2 | 7/2012 | Yedinak et al. | |
| 8,889,511 B2 | 11/2014 | Yedinak et al. | |
| 8,946,816 B2 * | 2/2015 | Bobde | H01L 29/0634 257/334 |

(Continued)

OTHER PUBLICATIONS

U.S. Appl. No. 16/948,806, filed Oct. 1, 2020, Specification and Drawings, pp. 1 to 33.

(Continued)

*Primary Examiner* — Nishath Yasmeen
(74) *Attorney, Agent, or Firm* — Abel Schillinger, LLP

(57) ABSTRACT

In an aspect, an electronic device can include a substrate, a semiconductor layer overlying the substrate and including a mesa adjacent to a trench, and a doped region within the semiconductor layer. The doped region extends across an entire width of the mesa and contacts the lowermost point of the trench. A charge pocket can be located between an elevation of the peak concentration of the doped region and an elevation of the upper surface of the substrate. In another aspect, a process includes patterning a semiconductor layer to define a trench, forming a sacrificial layer within the trench, removing the sacrificial layer from a bottom of the trench, doping a portion of the semiconductor layer that is along the bottom of the trench while a remaining portion of the sacrificial layer is along a sidewall of the trench.

21 Claims, 17 Drawing Sheets

(56) References Cited

U.S. PATENT DOCUMENTS

| | | | | |
|---|---|---|---|---|
| 9,620,585 | B1* | 4/2017 | Loechelt | H01L 29/36 |
| 10,236,342 | B2* | 3/2019 | Loechelt | H01L 29/0657 |
| 2010/0200910 | A1* | 8/2010 | Yedinak | H01L 29/407 |
| | | | | 438/589 |
| 2011/0248340 | A1* | 10/2011 | Hsieh | H01L 29/1095 |
| | | | | 257/334 |
| 2011/0316075 | A1* | 12/2011 | Hsieh | H10B 41/42 |
| | | | | 438/270 |
| 2012/0315747 | A1 | 12/2012 | Mauder et al. | |
| 2013/0277793 | A1 | 10/2013 | Lee et al. | |
| 2021/0230178 | A1 | 7/2021 | Nicolaou et al. | |

OTHER PUBLICATIONS

Guo et al.; "Process Characterization for Hydrogen and Helium Implantation"; 20th Int'l Conf. on Ion Implantation Tech.; IEEE; pp. 1-4 (2014).

Vobecky et al.; "High-Power Silicon p-i-n Diode With the Radiation Enhanced Diffusion of Gold"; IEEE Electron Device Letters; vol. 35, No. 3; pp. 375-377 (2014).

Ronsisvalle, C.; "Helium Irradiation as 'Localized' Lifetime Killer to Enhance IGBT Performance"; Fairchild Semiconductor; pp. 1-13 (2013).

Laven et al.; "Deep Doping Profiles in Silicon Created by MeV Hydrogen Implantation: Influence of Implantation Parameters"; CP1321, Ion Implantation Technology; Amer. Instit. of Physics; pp. 257-260 (2010).

Daliento et al.; "An Experimenal Analysis of Localized Lifetime and Resistivity Control by Helium Implant In Si"; Proc. of the 17th Int'l Syp. on Power Semiconductor Devices and ICs; IEEE; pp. 1-3, 162 (2005).

Vobecky et al.; "Fast Recovery Diode with Local Lifetime Control Using High-Energy Platinum and Helium Implantation"; 11th European Conference on Power Electronics and Applications; European Power Electronics and Drives Association; pp. p. 1-p. 7 (2005).

Fang et al.; "Numerical and Experimental Study of Localized Lifetime Control LIGBT by Low Energy He Ions Implantation"; IEEE; 1502-06 (2004).

Spirito et al.; "Characterization of Recombination Centers in Si Epilayers After He Implantation by Direct Measurement of Local Lifetime Distribution With the AC Lifetime Profiling Technique"; IEEE Electron Device Letters; vol. 25, No. 9; pp. 602-604 (2004).

Vobecky et al.; "Platinum Implantation Versus Platinum Silicide for the Local Lifetime Control of Power P-i-N Diode"; 24th Int'l Conf. on Microelectronics; IEEE' pp. 125-128 (2004).

David et al.; "Generation of Defects Induced by MeV Proton Implantation in Silicon—Influence of Nuclear Losses"; Nuclear Instruments and Methods in Physics Research; Elsevier Science B.V.; pp. 309-312 (2002).

Ntsoenzok et al.; "Co-Implantation of Hydrogen and Helium for Thermal Stabilization of Lifetime in Power Devices"; Nuclear Instruments and Methods in Physics Research; Elsevier Science B.V.; pp. 371-374 (2002).

Vobecky et al.; "High-Power P-i-N Diode With the Local Lifetime Control Based on the Proximity Gettering of Platinum"; IEEE Electron Device Letters; vol. 23, No. 7; pp. 392-394 (2002).

Rangan et al.; "Formation and Characterization of Multi-Layered Nanocavities in Silicon with Cascade Helium Implantation/Anneal"; IEEE; pp. 1360-1365 (2001).

Fang et al.; "High Speed LIGBT with Localized Lifetime Control by Using High Dose and Low Energy Helium Implantation"; IEEE; pp. 166-169 (2001).

Seibt et al.; "Phosphorus Diffusion Gettering of Platinum in Silicon: Formation of Near-Surface Precipitates"; Physica Status Solidi b; vol. 222, No. 1, John Wiley & Sons, Inc.; pp. 327-336 (2000).

Vobecky et al.; "Open Circuit Voltage Decay Lifetime of Ion Irradiated Devices"; Microelectronics Journal; Elsevier Science Ltd.; pp. 513-520 (1999).

Vobecky et al.; "Future Trends in Local Lifetime Control"; IEEE; pp. 161-164 (1996).

Wondrak et al.; "Helium Implantation for Lifetime Control in Silicon Power Devices"; 17th European Solid State Device Research Conference; IEEE; pp. 649-652 (1987).

* cited by examiner

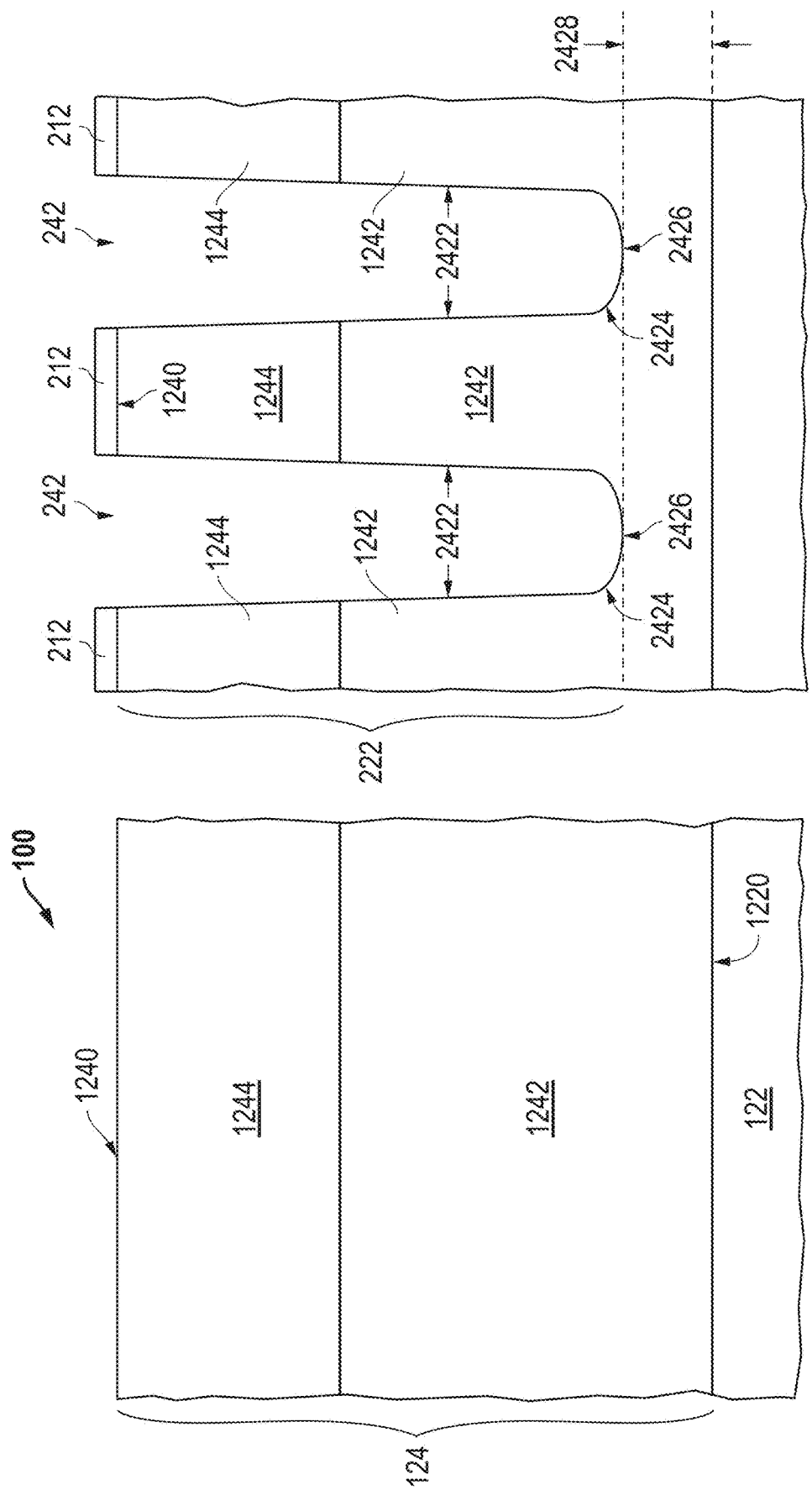

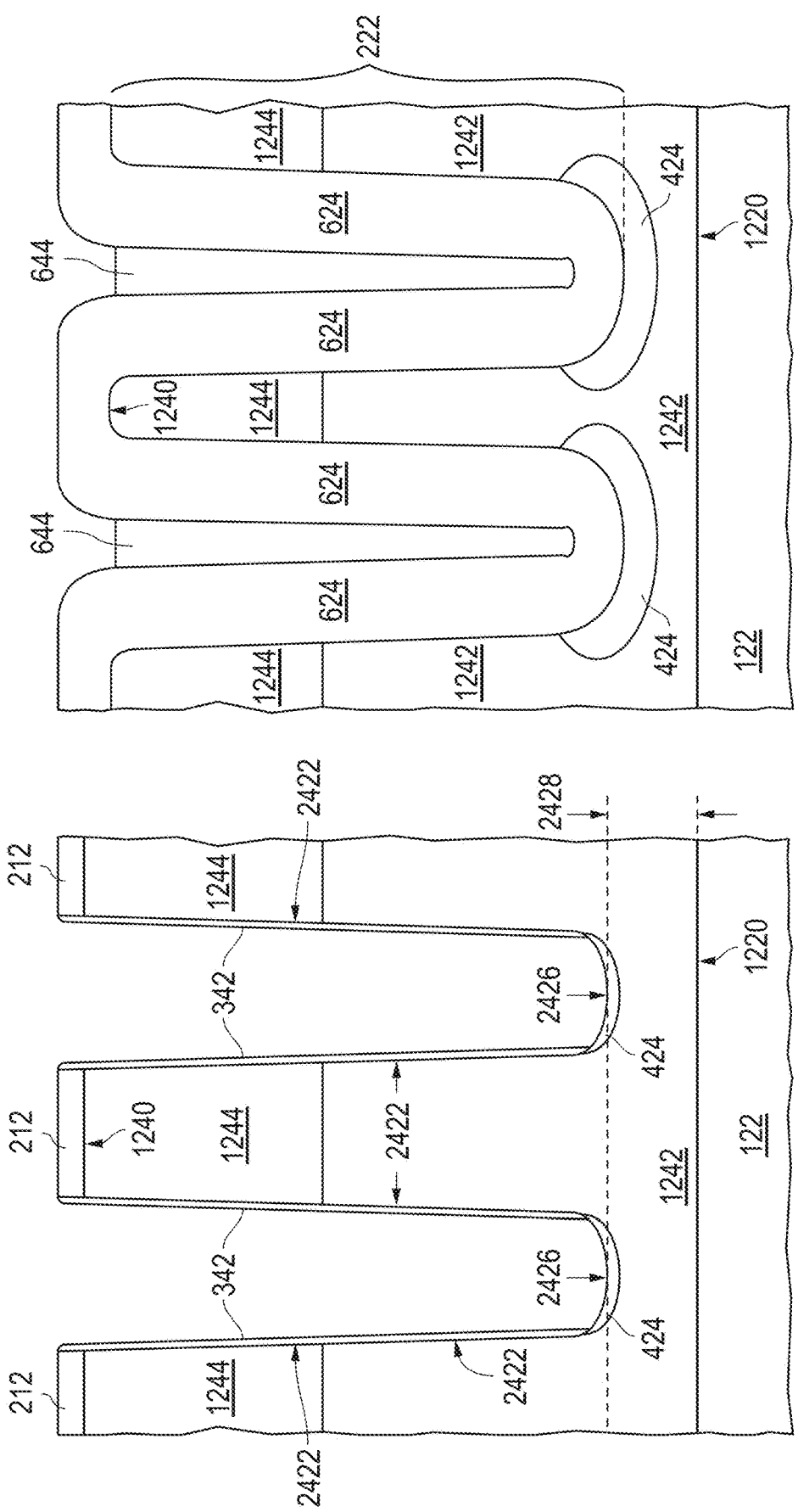

ELECTRONIC DEVICE INCLUDING A TRANSISTOR STRUCTURE

FIELD OF THE DISCLOSURE

The present disclosure relates to electronic devices, and more particularly to, electronic devices that include transistor structures and shield electrodes.

RELATED ART

A power metal-oxide-semiconductor field-effect transistor (MOSFET) may experience an unacceptably high voltage overshoot and reverse recovery charge during switching operations. High voltage overshoot can be reduced by increasing a thickness of an epitaxial silicon layer; however, increasing the thickness of the epitaxial silicon layer increases on-state resistance and reverse recovery charge, which is undesired. Further improvement in reducing voltage overshoot during switching operations is desired.

BRIEF DESCRIPTION OF THE DRAWINGS

Embodiments are illustrated by way of example and are not limited in the accompanying figures.

FIG. 1 includes an illustration of a cross-sectional view of a portion of a workpiece that includes a substrate and a semiconductor layer.

FIG. 2 includes an illustration of a cross-sectional view of the workpiece of FIG. 1 after forming a hard mask layer and removing portions of the semiconductor layer to define trenches, wherein mesas include portions of the semiconductor layer between the trenches.

FIG. 5 includes an illustration of a cross-sectional view of the workpiece of FIG. 4 after diffusing the doped regions.

FIG. 6 includes an illustration of a cross-sectional view of the workpiece of FIG. 5 after forming an insulating layer and shield electrodes.

FIG. 25 includes plots of peak overshoot drain-to-source voltage as a function of the current flowing through transistor structures before the transistor structures are switched to an off-state.

FIG. 26 includes an illustration of a cross-sectional view of a portion of a workpiece having a transistor structure with gate electrodes overlying shield electrodes.

Figure 4:
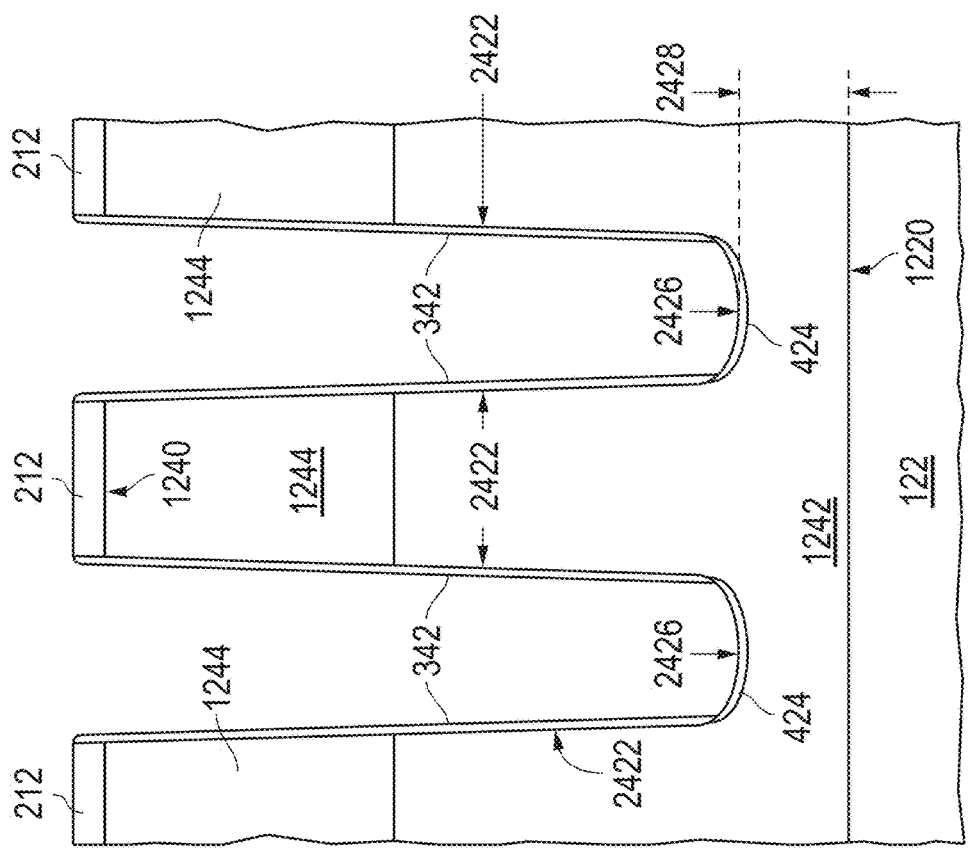
FIG. 4 includes an illustration of a cross-sectional view of the workpiece of FIG. 3 after forming doped regions within the semiconductor layer below the bottoms of the trenches.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

As used in this specification, length and width are measured in directions along or parallel to a primary surface of a substrate or a semiconductor layer. Depth, height, and thickness are measured in directions perpendicular to the primary surface of the substrate or the semiconductor layer.

The terms "horizontal," "lateral," and their variants are in directions along or parallel to a primary surface of a substrate or semiconductor layer, and the terms "vertical" and its variants are in directions perpendicular to a primary surface of the substrate or the semiconductor layer. Two objects that are laterally offset can be at the same or different elevations.

The term "power transistor" is intended to mean a transistor that has a drain-to-source breakdown voltage (BVDSS) of at least 50 V.

A border between a relatively heavily doped region or layer and an immediately adjacent and relatively lightly doped region or layer of the same conductivity type is where the dopant concentration of the relatively heavily doped region or layer is 10% of its peak dopant concentration within the relatively heavily doped region or layer.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element, but the elements do not contact each other and may have another element or elements in between the two elements.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about," "approximately," or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A power transistor can include a transistor structure that has a doped region within a semiconductor layer. The doped region has a peak concentration at an elevation that is near or below bottoms of trenches. The doped region reduces on-state resistance ($R_{DSON}$) for the transistor structure, as compared to an identical transistor structure except without the doped region. In the transistor structure with the doped region, a corresponding charge pocket lies between (1) the location of the peak dopant concentration of the doped region and (2) a location closer to the substrate where such location has a dopant concentration that is the same as the peak dopant concentration. The charge pocket stores minority charge carriers from diode forward bias conduction to recombine with majority charge carriers within the charge pocket during diode reverse recovery.

Drain current during the transient time period can be lower as compared to an identical transistor structure except without the doped region, and thus, the change in current as a function of time ($\partial i/\partial t$) is lower. Peak overshoot drain-to-source voltage ($V_{DSPK}$) can be kept below $BV_{DSS}$, and reverse recovery charge ($Q_{RR}$) is lower, as compared to a transistor structure without the doped region. Skilled artisans will appreciate that the improved performance with the novel transistor structure is achieved without unacceptable performance that can be seen with a conventional design without the doped region and the corresponding charge pocket. The transistor structure can have a $BV_{DSS}$ in a range from 50 V to 300 V. After reading the specification in its entirety, skilled artisans will appreciate that the concepts as described herein can be used with a transistor structure having a BVDss outside of the previously described range.

In an aspect, an electronic device can include a substrate including a first dopant having a first conductivity type; a semiconductor layer including a second dopant having the first conductivity type, wherein the semiconductor layer overlies the substrate and includes a mesa that is disposed immediately adjacent to a trench, the trench has a lowermost point along a bottom of the trench; an active region of a transistor structure is disposed within the mesa; a shield electrode within the trench; and a doped region within the semiconductor layer. The doped region extends across an entire width of the mesa and contacts the lowermost point of the trench, the doped region includes a third dopant having the first conductivity type, and along a vertical centerline of the mesa, an elevation of the peak dopant concentration of the third dopant within the doped region is between an elevation of the lowermost point of the trench and an elevation of an upper surface of the substrate.

In another aspect, an electronic device can include a substrate; a semiconductor layer overlying the substrate, wherein the semiconductor layer includes a mesa that is disposed adjacent to a trench, the trench has a lowermost point along a bottom of the trench; an active region of a transistor structure within the mesa; a shield electrode within the trench; and a charge pocket, wherein at least a majority of the charge pocket lies at an elevation below an elevation of the lowermost point of the trench, wherein the charge pocket is configured to allow minority charge carriers to recombine with majority charge carriers.

In a further aspect, a process can include patterning a semiconductor layer to define a trench extending partly, and not completely, through a thickness of the semiconductor layer, wherein the semiconductor layer overlies a substrate, the semiconductor layer and the substrate have a first conductivity type, and the semiconductor layer includes a mesa adjacent to the trench. The process can further include forming a sacrificial layer within the trench; removing the sacrificial layer from a bottom of the trench, wherein a remaining portion of the sacrificial layer is along a sidewall of the trench; and doping a portion of the semiconductor layer that is along the bottom of the trench, wherein doping is performed with a dopant having the first conductivity type, and doping is performed while the remaining portion of the sacrificial layer is along a sidewall of the trench.

FIG. 1 includes a cross-sectional view of a portion of a workpiece 100 that includes a substrate 122 and a semiconductor layer 124 that includes a lower semiconductor layer 1242, and an upper semiconductor layer 1244. The upper surface of the semiconductor layer 124 is the primary surface 1240, and the substrate 122 has an upper surface 1220. In another embodiment, the semiconductor layer 124 can include more or fewer semiconductor layers. After reading this specification, skilled artisans will be able to determine the number and thicknesses for the semiconductor layer within the semiconductor layer 124 to achieve electrical performance characteristics for a particular design of transistor structure.

Each of the substrate 122, the lower semiconductor layer 1242, and the upper semiconductor layer 1244 can be monocrystalline and include a semiconductor base material that includes at least one Group 14 element, such as Si, Ge, SiC, SiGe, or the like. In an embodiment, the substrate 122 can be in the form of a semiconductor wafer. The lower semiconductor layer 1242 can be epitaxially grown from the substrate 122, and the upper semiconductor layer 1244 can be epitaxially grown from the lower semiconductor layer 1242. The substrate 122, the lower semiconductor layer 1242, and the upper semiconductor layer 1244 can have the same conductivity type.

The substrate 122 can be doped with an n-type dopant or a p-type dopant and have a dopant concentration of at least $1 \times 10^{18}$ atoms/cm$^3$. In an embodiment, the substrate 122 is doped with As or Sb. In another embodiment, the substrate 122 can be doped with P; however, the lower semiconductor layer 1242 may be thicker to account for the higher diffusivity of P in the Group 14 semiconductor material of the lower semiconductor layer 1242. Increasing the thickness can cause $R_{DSON}$ to be higher. A simulation may be performed to determine if the increase in $R_{DSON}$ can be tolerated.

The lower semiconductor layer 1242 has a dopant concentration lower than the substrate 122. In an embodiment, the lower semiconductor layer 1242 can have a dopant concentration of in a range from $5 \times 10^{15}$ atoms/cm$^3$ to $1 \times 10^{17}$ atoms/cm$^3$. As used in this specification, the term "background dopant concentration" refers to the average dopant concentration of the lower semiconductor layer 1242 as originally formed or first doped if the lower semiconductor layer 1242 is originally formed as an undoped semiconductor layer.

As originally formed, the upper semiconductor layer 1244 is more lightly doped as compared to the lower semiconductor layer 1242. In an embodiment, the originally-formed upper semiconductor layer 1244 can have a dopant concentration of at most $1 \times 10^{16}$ atoms/cm$^3$ or can be undoped. During subsequent processing, dopant from the lower semiconductor layer 1242 can diffuse into the upper semiconductor layer 1244.

For each of the semiconductor layers 1242 and 1244, the dopant can be P. As compared to As and Sb, P has a higher diffusivity and allows the dopant concentrations adjacent to the interface between the substrate 122 and the lower semiconductor layer 1242 and adjacent to the interface between the lower and upper semiconductor layers 1242 and 1244 to be more graded and reduce the electrical fields at the interfaces. In another embodiment, the lower semiconductor layer 1242, the upper semiconductor layer 1244, or both can be doped with As or Sb.

The thicknesses of the lower semiconductor layer 1242 and the upper semiconductor layer 1244 can depend on $BV_{DSS}$ for the transistor structure and on the dopant concentrations of the lower semiconductor layer 1242 and the portion of the upper semiconductor layer 1244 between the lower semiconductor layer 1242 and a subsequently-formed body region. A drift region for the transistor structure being formed can include a combination of the portion of the upper semiconductor layer 1244 below such body region and the lower semiconductor layer 1242. In an embodiment, the thickness of the lower semiconductor layer 1242 can be in a range of 2 microns to 30 microns. In a same or different embodiment, the thickness of the upper semiconductor layer 1244 can be in a range from 0.3 micron to 5 microns. The thicknesses of the layers 1242 and 1244 may be outside the described ranges if needed or desired for a particular application.

FIG. 2 includes a cross-sectional view of the workpiece 100 after forming a patterned hard mask layer 212 and removing portions of the semiconductor layer 124 to define trenches 242. The hard mask layer 212 can be an insulating layer of one or more films of an oxide, a nitride, or an oxynitride. The thickness is sufficient to withstand etching performed to define the trenches 242. In an embodiment, the thickness of the hard mask layer 212 is in a range from 400 nm to 1500 nm.

Exposed portions of the semiconductor layer 124 are removed to define the trenches 242. The trenches 242 can have vertical or nearly vertical sidewalls 2422 and bottoms 2424. The dashed lines in FIG. 2 illustrate where the bottoms 2424 of the trenches 242 start. The sidewalls of the trenches 242 can be perpendicular to the primary surface 1240 or up to 5° from perpendicular to the primary surface 1240.

The trenches 242 extend from the primary surface 1240 toward the substrate 122. In an embodiment, the trenches 242 extend through part, and not all, of the thickness of the semiconductor layer 124. In the embodiment illustrated in FIG. 2, the trenches 242 extend through the entire thickness of the upper semiconductor layer 1244 and part, and not all, of the thickness of the lower semiconductor layer 1242.

The depths of the trenches 242 may be selected based on $BV_{DSS}$ of the transistor being formed. The embodiments as described herein are well suited for $BV_{DSS}$ in a range from 20 V to 300 V, although the concepts described herein can be extended to transistors having $BV_{DSS}$ outside such range. In an embodiment, the depths of the trenches 242 can be in a range from 1.1 microns to 20 microns. The depths of the trenches 242 may be outside the range if needed or desired for a particular application.

The lowermost points 2426 along bottoms 2424 of the trenches 242 are at an elevation in a range from 1.1 microns to 9.9 microns above an elevation the upper surface 1220 of the substrate 122. Such elevation is illustrated by a dimension 2428 in FIG. 2. A smaller elevational difference can result in a thinner charge pocket, lower $R_{DSON}$, lower $Q_{RR}$, and higher $V_{DSPK}$, and a greater elevational difference can result in a wider charge pocket higher $R_{DSON}$, higher $Q_{RR}$, and lower $V_{DSPK}$. More details regarding the charge pocket are described later in this specification.

To allow for a reasonably small area occupied by the transistor structures, widths of mesas 222 and trenches 242 can be relatively small as compared to the depths of the trenches 242. Each mesa 222 is the portion of the semiconductor layer 124 immediately adjacent to trenches 242 and extend to an elevation corresponding to the lowermost points 2426 of the immediately adjacent trenches 242, where such elevation is illustrated with a dashed line in FIG. 2. The widths of the mesas 222 are sufficiently wide to allow source regions and body contact regions to be formed near the primary surface 1240. A subsequent doping operation will be performed such that, for each mesa 222, a doped region extends across the entire width of the mesa 222, and thus, the mesa 222 cannot be too wide. The trenches 242 are sufficiently wide to allow shield electrodes, gate electrodes, and dielectric layers to be formed within the trenches 242. As the widths of the trenches 242 increase, fewer mesas can be formed. In an embodiment, the mesas 222 and trenches 242 have widths in a range from 0.5 micron to 3.0 microns. The widths of the mesas 222 and trenches 242 are measured at 0.5 micron below the primary surface 1240. The widths of the trenches 242 and the mesas 222 may be outside the ranges if needed or desired for a particular application.

Figure 3:
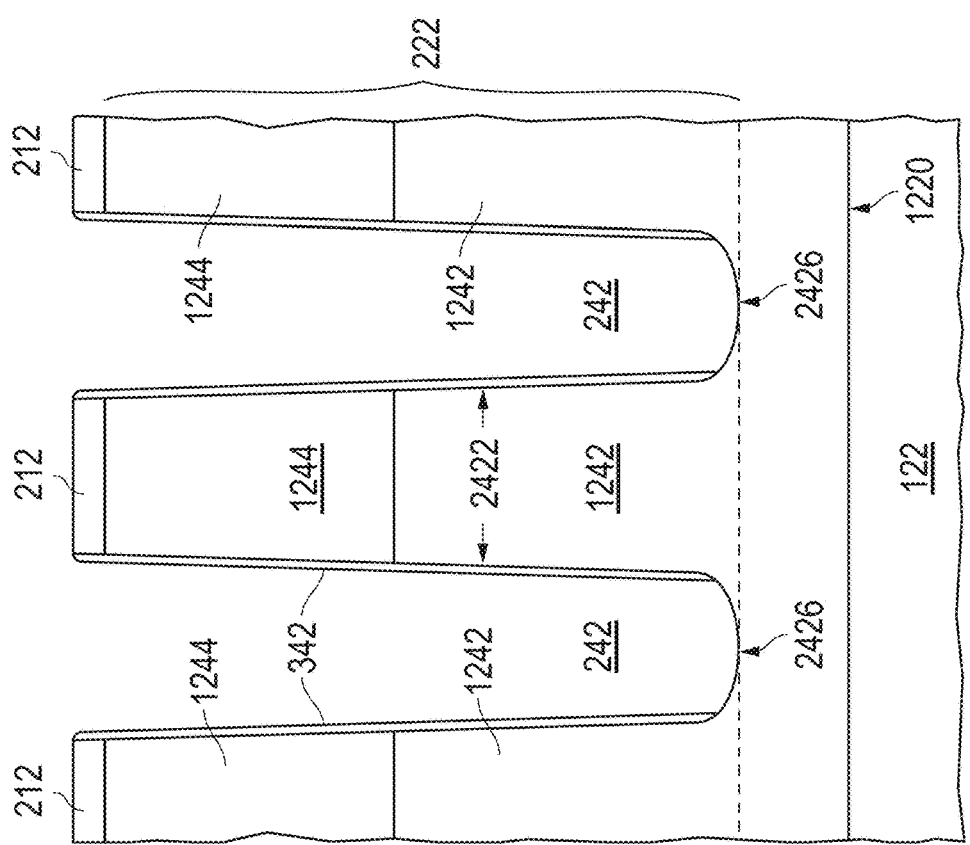
FIG. 3 includes an illustration of a cross-sectional view of the workpiece of FIG. 2 after forming an insulating layer and removing portions of the insulating layer along bottoms of the trenches.

In FIG. 3, a sacrificial layer 342 is formed within the trenches 242, and the portions of the sacrificial layer 342 along the bottoms 2424 of the trenches 242 are removed leaving remaining portions of the sacrificial layer 342 along the sidewalls 2422. The sacrificial layer 342 includes a material that can be selectively etched as compared to the lower semiconductor layer 1242. In an embodiment, the sacrificial layer 342 includes one or more films of an oxide, a nitride, or an oxynitride. The sacrificial layer 342 can be deposited or grown. The sacrificial layer 342 has a thickness sufficient to stop dopant ions from entering mesas 222 along the sidewalls 2422 of the trenches 242. When the sacrificial layer 342 is too thick, an insufficient area of the semiconductor layer 124 under the bottoms 2424 of the trenches 242 can result in not enough dopant within the semiconductor layer 124. As originally formed, the thickness of the sacrificial layer 342 is in a range from 40 nm to 200 nm.

The portions of the sacrificial layer 342 as originally formed along the bottoms 2424 of the trenches 242 can be removed by anisotropically etching the sacrificial layer 342. Near the tops of the trenches 242, the sacrificial layer 342 has an arcuate shape after the etch. The thickness of the remaining portions of the sacrificial layer 342 along the sidewalls 2422 of the trenches 242 is sufficient to stop the dopant from entering the mesas 222 along the sidewalls 2422. The thickness of such remaining portions of the sacrificial layer 342 is at least 20 nm. In an embodiment, the thickness of the remaining portions of the sacrificial layer 342 along the sidewalls 2422 is in a range from 40 nm to 150 nm.

The semiconductor layer 124 along the bottoms 2424 of the trenches 242 is doped with a dopant having the same conductivity type as the lower semiconductor layer 1242 to form doped regions 424, as illustrated in FIG. 4. In an embodiment, doping is performed using ion implantation. As or Sb can be implanted into the doped regions 424, so that the dopant does not diffuse too far. In another embodiment, P can be implanted; however, as compared to implanting with As or Sb, the elevational difference (dimension 2428) between the lowermost points 2426 of the trench 242 and the upper surface of the substrate 122 may need to be increased to account for the higher diffusivity of P (as compared to the diffusivity of As and Sb).

The ion implantation can be performed using a dose, energy, and tilt angle to allow a charge pocket to be formed at an elevation between the lowermost points 2426 of the trenches 242 and the upper surface 1220 of the substrate 122. In an embodiment, ion implantation is performed using no tilt angle (0° from vertical). Due to possible manufacturing tolerances, the tilt angle can be within 1° from vertical. No tilt angle or a small tilt angle allows the dopant to enter the lower semiconductor layer 1242 adjacent to the bottoms 2424 of the trenches 242 and helps to keep the dopant from being implanted into portions of the mesas 222 along the sidewalls 2422 of the trenches 242.

Regarding dose, if the dose is too low, the charge pocket may be too large increasing $Q_{RR}$ and $Q_{DSON}$ and lowering $V_{DSPK}$, and if the dose is too large $Q_{RR}$ and $Q_{DSON}$ decrease and $V_{DSPK}$ increases. Thus, there is a trade-off between $Q_{DSON}$, $Q_{RR}$, and $V_{DSPK}$ that can be optimized. Simulations can be performed or empirical data generated to determine a doping profile within a finished device, and a dose corresponding to the doping profile can be determined by skilled artisans. In an embodiment, the dose is in a range from $5 \times 10^{14}$ ions/cm$^2$ to $5 \times 10^{15}$ ions/cm$^2$. A relatively low energy can be used to keep the depth of the peak dopant concentration relatively shallow and from penetrating the sacrificial layer 342 on the trench sidewall 2422. The implant energy can depend on the dopant used. In an embodiment, the dopant can include As or Sb, and the implant energy can be in a range from 5 keV to 95 keV. In another embodiment, the dopant can include P, and the implant energy can be in a range from 3 keV to 30 keV. After reading this specification, skilled artisans will appreciate that doses and energies outside the ranges may be used without deviating from the concepts taught herein.

Referring to FIGS. 4 and 5, a thermal cycle can be performed to diffuse the dopant in the doped regions 424. The temperature and time of the thermal cycle can depend on the diffusivity of the dopant within the doped regions 424 and the widths of the mesas 222. The thermal cycle can be a separate operation or may be part of one or more thermal operations, such as growing an insulating layer, activating a dopant within a subsequently-formed doped region, or another suitable thermal operation. The temperature for the thermal cycle can be in a range from 800° C. to 1175° C. For As or Sb, the thermal cycle can be performed for a time in a range of 15 minutes to 60 minutes, and for P, the thermal cycle can be performed for a time in a range of 10 minutes to 30 minutes. Simulations or empirical data can be used to determine a time and temperature of the thermal cycle to achieve a merged doped region 524 (illustrated in FIG. 7) from the doped regions 424. An exemplary doping profile for a finished device is described later in this specification, as the doping profile can change during subsequent thermal cycles, such as thermally growing an oxide or an anneal follow a doping operation.

The remaining portions of the sacrificial layer 342, the hard mask layer 212, and any other oxide within the trenches 242 are removed.

FIG. 6 illustrates the workpiece 100 after forming an insulating layer 624 and shield electrodes 644. The insulating layer 624 fills part, and not all, of the trenches 242. The insulating layer 624 can include one or more films that include an oxide, a nitride, or an oxynitride. The thickness of the insulating layer 624 can be selected to provide a desired capacitance between a lower portion of the shield electrodes and the adjacent mesas 222. In an embodiment, the insulating layer 624 has a thickness of in a range from 110 nm to 1800 nm, and in a more particular embodiment, in a range from 200 nm to 1000 nm. The insulating layer 624 can be deposited, thermally grown, or a combination of both. If the insulating layer 624 is thermally grown, the previously-described thermal cycle for the doped regions 424 may be modified or eliminated to help keep the doped region 524 from diffusing too far. In the embodiment illustrated in FIG. 6, the doped regions 424 have diffused further and have not merged together at this point in the process.

A conductive layer can be deposited to fill remaining portions of the trenches 242. Portions of the conductive layer lying along the upper horizontal surface of the insulating layer 624 can be removed to form the shield electrodes 644. The conductive layer can include a single film or a plurality of films. The composition of the conductive layer may depend on subsequent thermal cycles to which the shield electrodes 644 will be subsequently exposed. A doped semiconductor or a conductive refractory material can be used when the conductive layer is subsequently exposed to temperatures of at least 700° C. In an embodiment, the conductive layer may include an adhesion film or a barrier film. In an embodiment, the conductive layer can include a doped semiconductor material, a refractory metal, a refractory silicide, or a refractory nitride. Such a conductive material may include doped polycrystalline Si, doped amorphous Si, doped SiC, Ta, TaSi, Ti, TiW, TiSi, TiN, W, or the like. In a particular embodiment, the conductive layer includes a base material that is the same as the base material within the mesas 222 to reduce stress within the workpiece 100 due to subsequent thermal cycles. For example, the conductive layer can include heavily doped Si (e.g., dopant concentration of at least $1\times10^{19}$ atoms/cm$^3$) when the mesas 222 include monocrystalline Si. After reading this specification, skilled artisans will be able to determine the number of films and materials for the conductive layer to meet the needs or desires for a particular application. Portions of the conductive layer that are outside the trenches 242 are removed to complete formation of the shield electrodes 644 as illustrated in FIG. 6.

Figure 7:
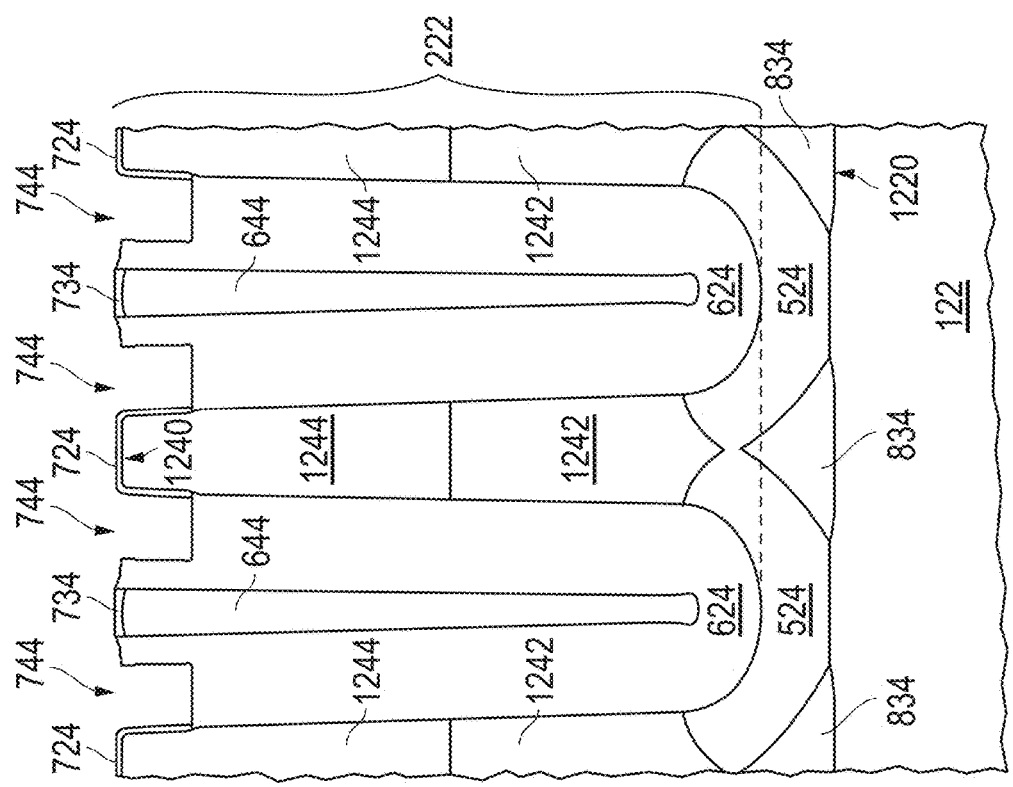
FIG. 7 includes an illustration of a cross-sectional view of the workpiece of FIG. 6 after removing portions of the insulating layer to recess it within the trenches and forming a gate dielectric layer and insulating members.

FIG. 7 includes an illustration after portions of the insulating layer 624 are removed, and a gate dielectric layer 724 and insulating members 734 are formed. A masking layer (not illustrated) can be formed to protect portions of the insulating layer 624 that contact the shield electrodes 644. Exposed portions of the insulating layer 624 can be etched to remove portions of the insulating layer 624 overlying the primary surface 1240 and to recess the insulating layer 624 within the trenches 242. The depths of the recessions 744 correspond to the heights of subsequently-formed gate electrodes. The removal can be performed by plasma etching using endpoint detection and a timed overetch to achieve the desired depths of the recessions 744. The gate dielectric layer 724 includes an oxide or an oxynitride and can have a thickness in a range of 5 nm to 300 nm. The gate dielectric layer 724 can be thermally grown (illustrated in FIG. 7) or deposited. When forming the gate dielectric layer 724, the doped regions 424 (seen in FIG. 6) merge together to form the doped region 524 that extends across the entire widths of the mesas 222. Charge pockets 834 are between the doped region 524 and the upper surface 1220 of the substrate 122. In the embodiment illustrated in FIG. 7-8, each of the charge pockets 834 has a generally triangular shape.

Figure 8:
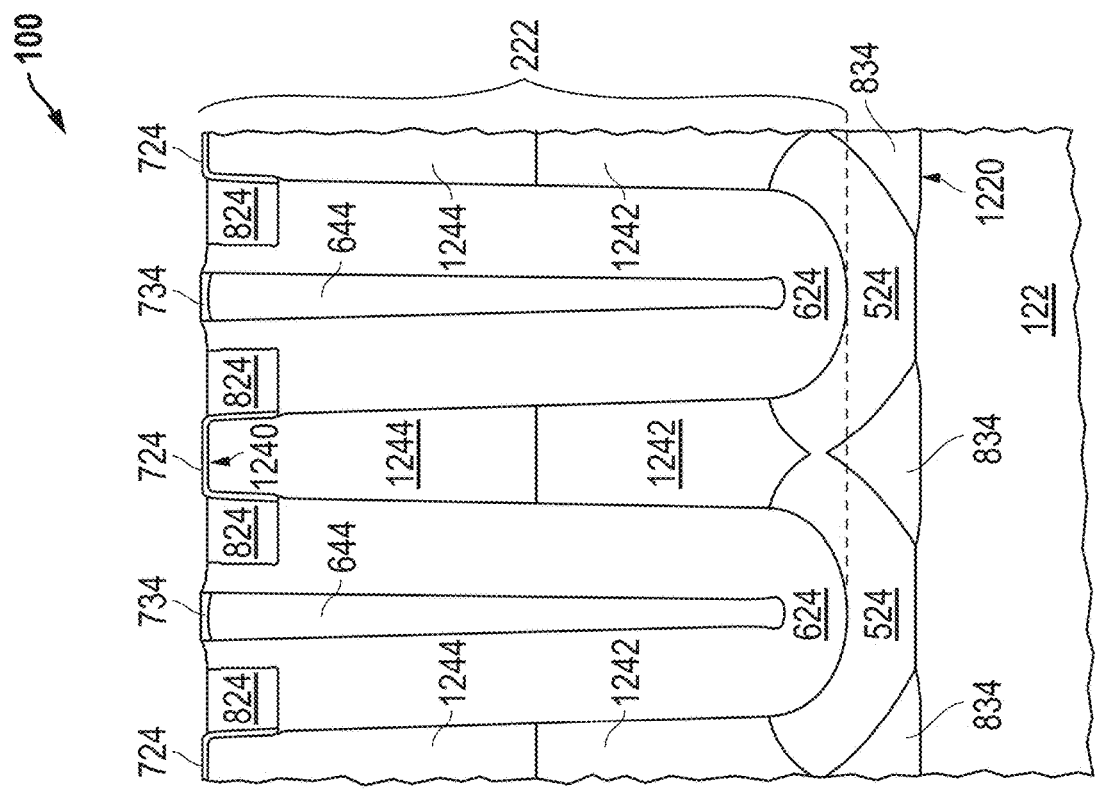
FIG. 8 includes an illustration of a cross-sectional view of the workpiece of FIG. 7 after forming gate electrodes.

FIG. 8 includes an illustration after forming gate electrodes 824. A conductive layer can be deposited to fill a remaining portion of the trenches 242 and along the gate dielectric layer 724. The conductive layer can include any of the materials as previously described with respect to the conductive layer for the shield electrodes 644. The conductive layer for the gate electrodes 824 can have the same composition or a different composition as compared to the shield electrodes 644. The conductive layer is etched and recessed within the trenches 242 to form the gate electrodes 824.

Figure 9:
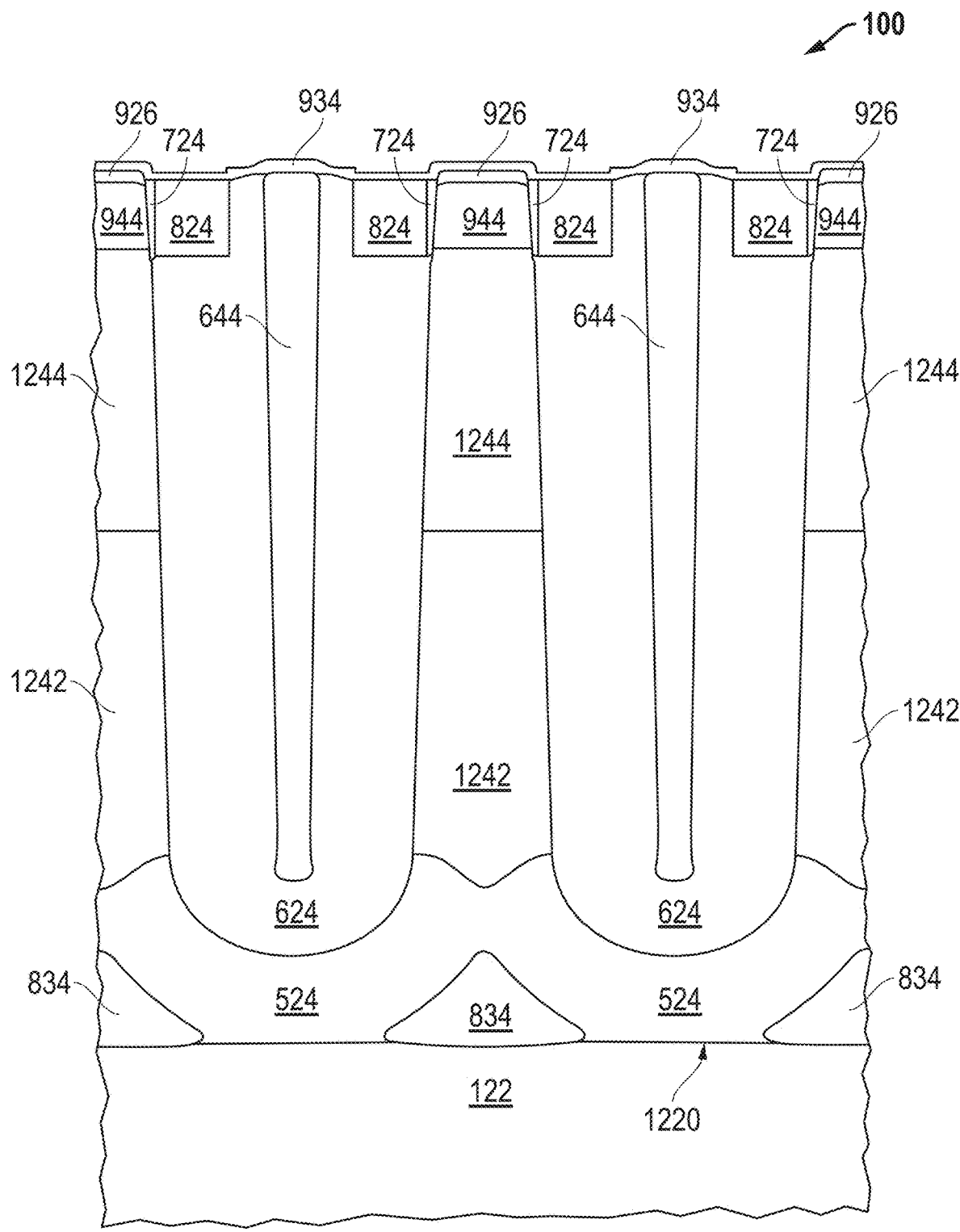
FIG. 9 includes an illustration of a cross-sectional view of the workpiece of FIG. 8 after forming body regions and source regions.

FIG. 9 includes an illustration of the workpiece 100 after forming an insulating layer 934, body regions 944, and source regions 926. The insulating layer 934 can be deposited over the workpiece 100 after forming the gate electrodes 824. The insulating layer 934 can include an oxide, a nitride, or an oxynitride. The body regions 944 have a conductivity type opposite a conductivity type of the source regions 926 and the substrate 122. Portions of the body regions 944 at the sidewalls of the trenches 242 are channel regions for the transistor structures. The dopant concentration of the body regions 944 affects the threshold voltage of the transistor structures. In an embodiment, the dopant concentration of the body regions 944 is in a range of $1\times10^{15}$ atoms/cm$^3$ to $5\times10^{17}$ atoms/cm$^3$ to achieve the desired threshold voltage ($V_{TH}$), where $V_{TH}$ also is affected by the composition and thickness of gate dielectric layer 724. The source regions 926 have dopant concentrations that allow ohmic contacts to be formed to a subsequently-formed conductive layer. In an embodiment, the dopant concentration of the source regions 926 can be in a range of $5\times10^{18}$ atoms/cm$^3$ to $1\times10^{21}$ atoms/cm$^3$.

Figure 10:
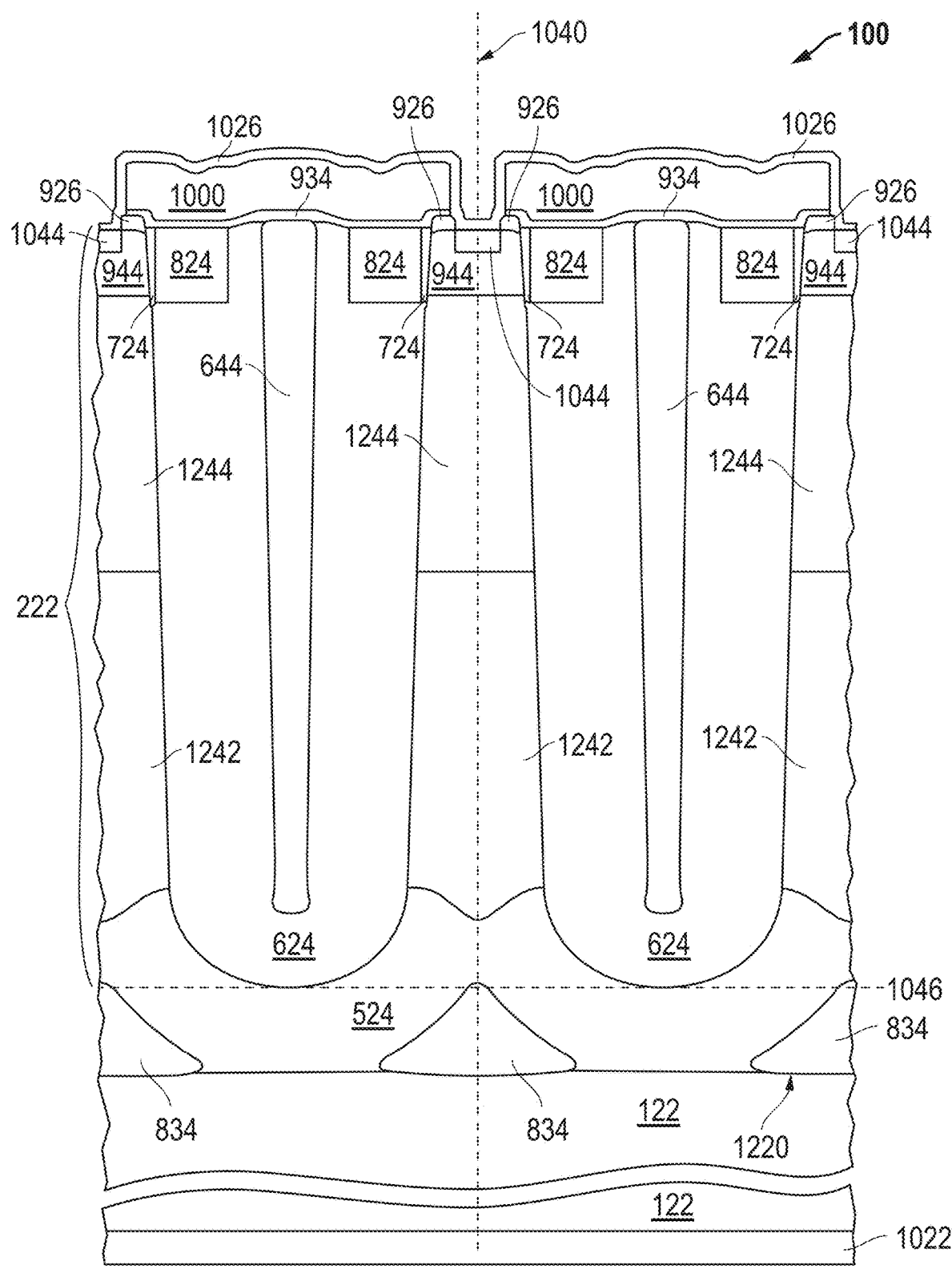
FIG. 10 includes an illustration of a cross-sectional view of the workpiece of FIG. 9 after forming a substantially completed electronic device.

FIG. 10 includes an illustration of a substantially completed electronic device. An interlevel dielectric (ILD) layer 1000 can be formed over the exposed surface of the workpiece 100. The ILD layer 1000 can include a single film or a plurality of films. The single film or each of the films can include an oxide, a nitride, or an oxynitride. In an embodiment, the ILD layer 1000 can have a thickness in a range from 20 nm to 2000 nm. The ILD layer 1000 can be patterned to define contact openings that extend through the source regions 926 to the body regions 944. Dopant can be introduced to form body contact regions 1044 that have a dopant concentration in a range of $5\times10^{18}$ atoms/cm$^3$ to $1\times10^{21}$ atoms/cm$^3$. An anneal may be performed at this point in the process to activate the dopants introduced into the mesas 222 after the gate electrodes 824 are formed. At other locations not illustrated in FIG. 10, the ILD layer 1000 can also be patterned to define contact openings that extend through the ILD layer 1000 to the gate electrodes 824, and other contact openings (not illustrated) to the shield electrodes 644. In another embodiment, the contact openings for the source regions 926 can be extended to expose the shield electrodes 644 if source interconnects 1026 are to contact the source regions 926 and shield electrodes 644.

A conductive layer is formed over the ILD layer 1000 and within the contact openings. The conductive layer can include a single film or a plurality of films. In an embodiment, the conductive layer can include an adhesion film or a barrier film. Such films may include Ta, TaSi, Ti, TiW, TiSi, TiN, W, or the like. The conductive layer can further include a conductive bulk film. The bulk film can include Al, Cu, or another material that is more conductive than other films within the conductive layer. In an embodiment, the bulk film can include at least 90 wt. % Al or Cu. The bulk film can have a thickness that is at least as thick as the other films within the conductive layer. In an embodiment, the bulk film has a thickness in a range from 20 nm to 6000 nm. More or fewer films can be used in the conductive layer. The number and composition of the films within the conductive layer can depend on the needs or desires for a particular application. After reading this specification, skilled artisans will be able to determine the composition of the conductive layer that is tailored to their devices. The conductive layer is patterned to complete formation of interconnects, including a source interconnect 1026 and a gate interconnect (not illustrated). The source interconnects 1026 make ohmic contact with the source regions 926, the body contact regions 1044, and the shield electrodes 644 (at a location not seen in FIG. 10), and the gate interconnect makes ohmic contact to the gate electrodes 824.

After an optional backgrind operation, backside metal 1022 is formed along or attached to the backside of the workpiece 100 and forms an ohmic contact with the substrate 122. The backside metal 1022 may include any of the materials previously described with respect to the conductive layer for the interconnects. The backside metal 1022 may also include Cu, Ni, Au, Ag, or another material that well suited for plating. In a further embodiment, the backside metal 1022 may be attached to the backside of the workpiece.

In a finished device, the source interconnect 1026 can be coupled to a source terminal for the transistor structure, the gate interconnect can be coupled to a gate terminal for the transistor structure, and the backside metal 1022 can be electrically connected to a drain terminal for the transistor structure. In an embodiment, the couplings are electrical connections.

In the finished device, the doped region 524 extends across the entire widths of the mesas 222. A peak dopant concentration of the doped region 524 is in a range from $5 \times 10^{16}$ atoms/cm$^3$ to $5 \times 10^{18}$ atoms/cm$^3$ along a vertical centerline 1040 through a mesa 222. The portions of the lower semiconductor layer 1242 between the doped region 524 and the substrate 122 are charge pockets 834 that are described in more detail later in this specification.

In FIGS. 6 to 10, the borders of the doped regions 424, the doped region 524, and the substrate 122 are represented by iso-concentration lines where the net doping concentration is $5 \times 10^{17}$ atoms/cm$^3$. The physical border between substrate 122 and lower semiconductor layer 1242 is at a lower elevation (farther from the trenches 242) than is illustrated in FIGS. 6 to 10. The illustrated border between the substrate 122 and the lower semiconductor layer 1242 and the doped region 524 is used to simplify understanding the concepts as described herein.

Figure 11:
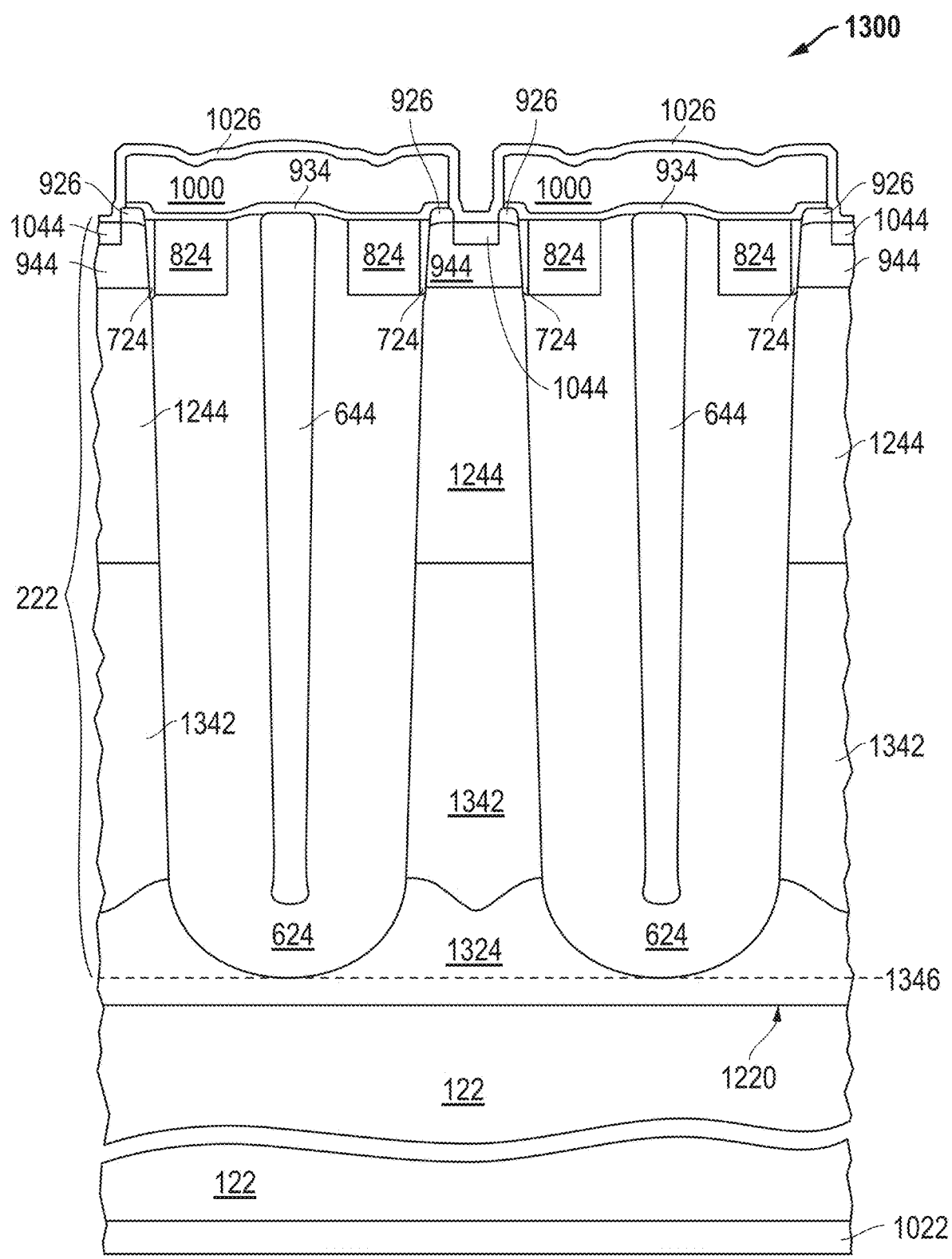
FIG. 11 includes an image of a cross-sectional view of the electronic device.
Figure 12:
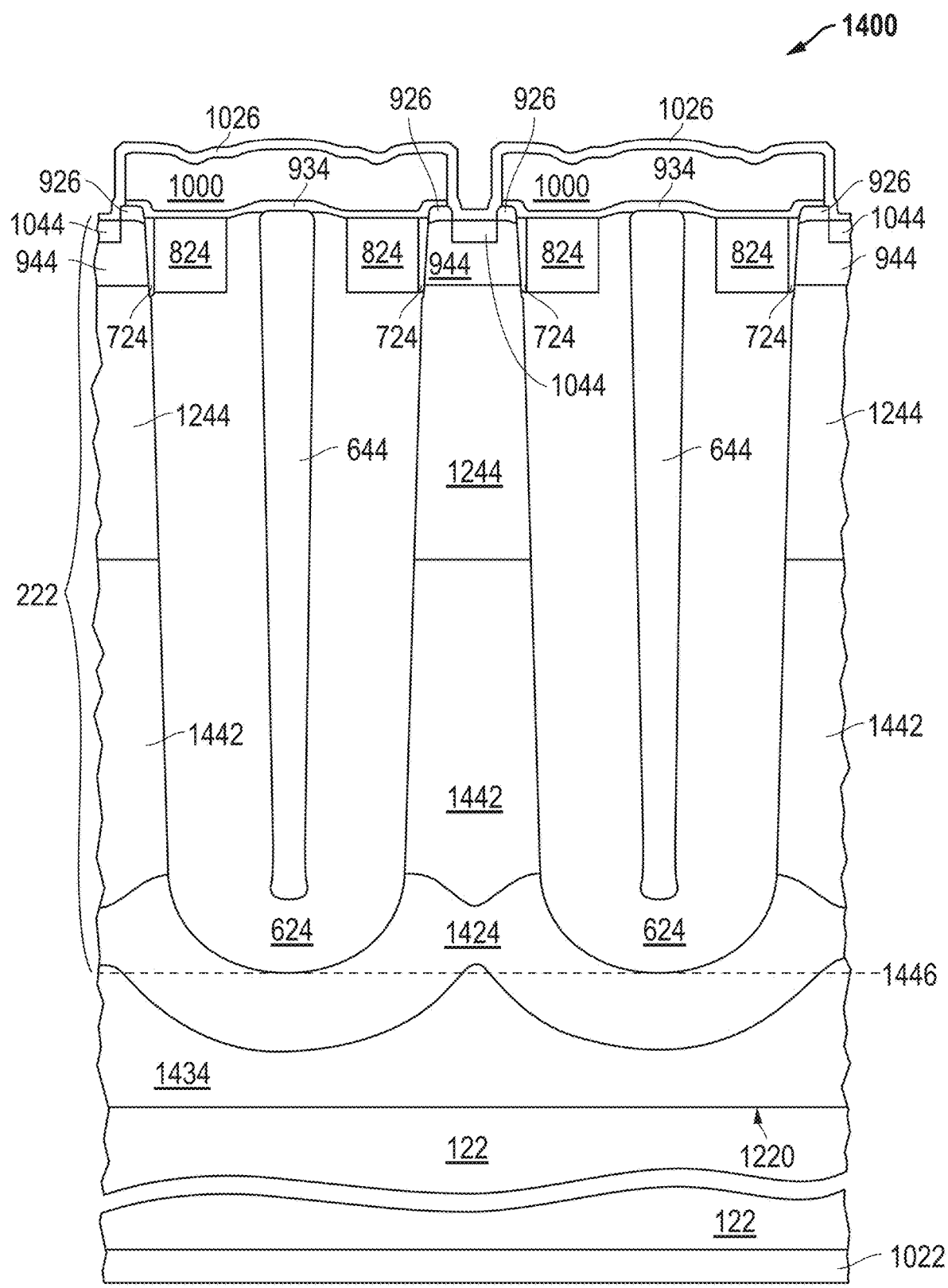
FIG. 12 includes an image of a cross-sectional view of an enlarged portion of the electronic device of FIG. 11 near the trench bottoms.

FIG. 11 includes an image of a cross-sectional view of a portion of an electronic device including transistor structures. In reference to FIG. 10, the horizontal line closer to the bottom of FIG. 11 corresponds to the interface between the substrate 122 and the lower semiconductor layer 1242. The doped region 524 lies along the bottom of the trenches and extends into the mesas 222. Shield electrodes 644 are within the centers of the trenches 242, and the gate electrodes 824 are near the tops of the trenches 242. FIG. 12 includes an enlarged view of a portion of the image in FIG. 11 near the bottoms of the trenches. The doped region 524, the charge pockets 834, and interface between the substrate 122 and the lower semiconductor layer 1242 are more clearly seen in FIG. 12.

Different thicknesses can be used for the lower semiconductor layer. In FIG. 10, the thickness of the semiconductor layer 124 (combination of semiconductor layer 1242 and 1244) can be 13.0 microns. Workpieces 1300 and 1400 in FIGS. 11 and 12 have different thicknesses for the lower semiconductor layer. In FIG. 11, the sum of the thicknesses of a lower semiconductor layer 1342 and the upper semiconductor layer 1244 is 12.1 microns. The doped regions 424 (seen in FIGS. 4 to 6) merge together with dopant from the substrate 122 to form a doped region 1324. Unlike FIG. 10, no lighter doped portions (net doping concentration of less than $5 \times 10^{17}$ atoms/cm$^3$) of the lower semiconductor layer 1342 are between the doped region 1324 and the substrate 122. Thus, no charge pocket is formed.

In FIG. 12, the sum of the thicknesses of a lower semiconductor layer 1342 and the upper semiconductor layer 1244 is 13.9 microns. The doped regions 424 (seen in FIGS. 4 to 6) merge together to form a doped region 1424. Unlike FIG. 10, a charge pocket 1434 (net doping concentration of less than $5 \times 10^{17}$ atoms/cm$^3$) separates all of the doped region 1424 from the substrate 122. As compared to FIG. 10, the transistor structure in FIG. 12 has a higher $R_{DSON}$. The embodiment in FIG. 12 is an acceptable alternative, as long as $R_{DSON}$ for the transistor structure in FIG. 12 can be tolerated for a particular application.

Figure 13:
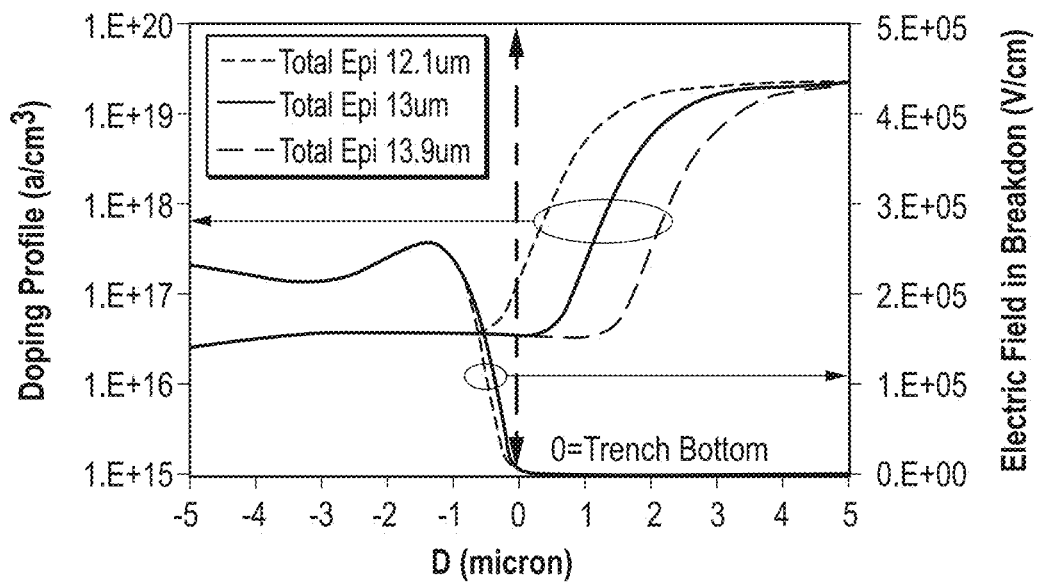
FIG. 13 includes an illustration of a cross-sectional view of a portion of a workpiece similar to the electronic device in FIG. 10 except with a thinner lower semiconductor layer.
Figure 14:
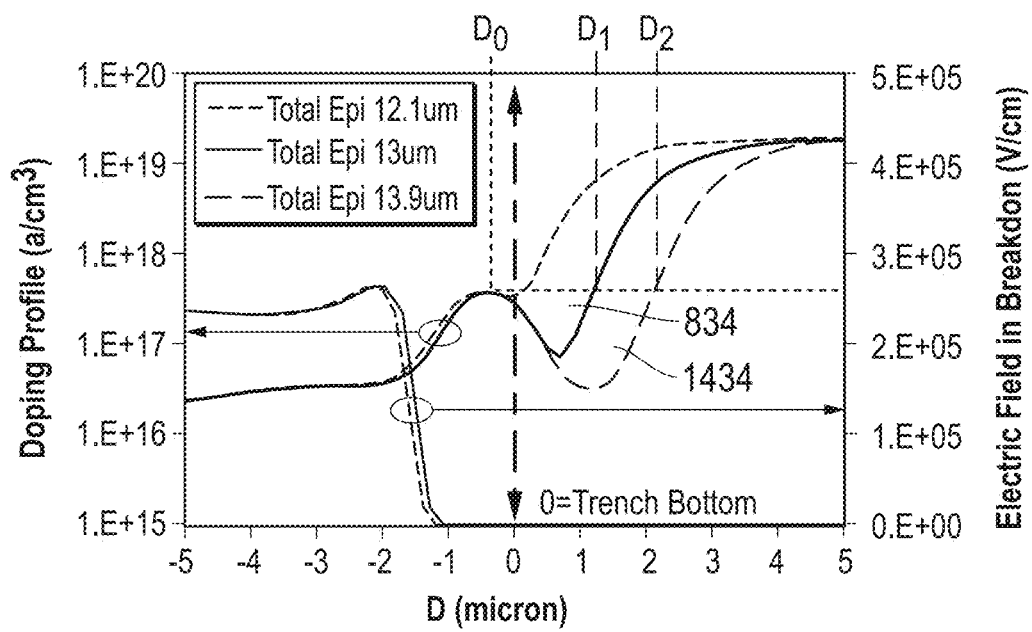
FIG. 14 includes an illustration of a cross-sectional view of a portion of a workpiece similar to the electronic device in FIG. 10 except with a thicker lower semiconductor layer.

FIGS. 13 and 14 compare electrical fields and net doping profiles for transistor structures, where FIG. 13 corresponds to the transistor structures in FIGS. 10, 11, and 12 except that they do not have the doped region near the bottom of the trenches 242, and FIG. 14 corresponds to the transistor structures in FIGS. 10, 11, and 12 having doped regions 524, 1324, and 1424, respectively. Thus, the transistor structures are substantially identical except the transistor structures for FIG. 13 do not include the doped regions and the transistor structures for FIG. 14 include the doped region 524, 1324, and 1424 in FIGS. 10, 11, and 12, respectively.

The electrical fields and dopant profiles are along vertical centerlines of mesas for the transistor structures in FIGS. 10, 11, and 12. The vertical centerlines through the mesas are halfway between immediately adjacent trenches and in a direction perpendicular to the primary surface 1240. FIG. 10 includes a dashed line that corresponds to a vertical centerline 1040 through one of the mesas 222. Although not illustrated in FIGS. 11 and 12, the vertical centerlines through the mesas are at an identical location as illustrated with the vertical centerline 1040 in FIG. 10.

The x-axis in FIGS. 13 and 14 is the vertical distance (D) within the lower semiconductor layer 1242 starting at an elevation corresponding to the bottoms 2424 of the trenches 242, and such elevation is illustrated by dashed line 1046 in FIG. 10. Thus, D=0 is at the dashed line 1046 in FIG. 10, dashed line 1346 in FIG. 11, and dashed line 1446 in FIG. 12 and are at an elevation of the lowermost points of the trenches 242. Positive values along the x-axis are closer to the substrate 122 (deeper into the transistor structure), and negative values along the x-axis are closer to the primary surface 1240 (shallower).

The plots for electrical field as a function of D is substantially similar for transistor structures in FIGS. 13 and 14. The electrical fields go to 0 just as the net doping concentration begins to rise due to dopant from the substrate 122 (FIG. 13) and from the doped region 524 in FIG. 10, the doped region 1324 in FIG. 11, and the doped region 1424 in FIG. 12 (FIG. 14).

Referring to FIGS. 13 and 14, the doping profiles are substantially similar for transistor structures, where D is in a range from −5.0 microns to −2.0 microns.

In FIG. 13, at D of approximately −0.5 micron and deeper, the net doping concentration increases due to diffusion of dopant from the substrate 122 into the lower semiconductor layer 1242 during the fabrication process. The transistor structure without the doped region 524 does not have a charge pocket.

Referring to FIG. 14, the transistor structure has the doped region 524 that starts at D of approximately −1.7 microns. Within the center of the mesa 222, the peak dopant concentration of the doped region 524 is at $D_0$, which is approximately −0.6 microns. As D increases, the doping concentration decreases until the dopant that diffused from the substrate 122 is reached. As D further increases, the doping concentration eventually reaches the dopant concentration within the substrate 122.

A charge pocket is not formed in the transistor structure illustrated in FIG. 11, because the lower semiconductor layer 1342 is not thick enough below the bottom of the trenches. Referring to FIG. 10, the charge pockets 834 are formed between the mesa 222 and the substrate 122 (between $D_0$ and $D_1$) and corresponds to the generally triangular-shaped portions of the lower semiconductor layer 1242. Referring to FIG. 12, the charge pocket 1434 is formed between the mesa 222 and the substrate 122 (between $D_0$ and D) and corresponds to the portion of the lower semiconductor layer 1442 between the doped region 1424 and the substrate 122 (between $D_0$ and $D_2$).

The peak dopant concentration of the doped region 524 and the doped region 1424 (at $D_0$ in FIG. 14) is 1.1 to 250 times higher than the minimum dopant concentration (to the right-hand side of $D_0$) within a charge pocket, such as the charge pockets 834 or the charge pocket 1434. In the center of the mesa, the peak dopant concentration for the doped region 524 is approximately $5\times10^{17}$ atoms/cm$^3$ and is at $D_0$, which is approximately −0.4 microns. In an embodiment, a charge pocket has a thickness in a range from 0.3 micron to 5.0 microns.

When the combined thickness of the lower and upper semiconductor layers 1242 and 1244 is 13.0 microns, $D_1$ is where the doping concentration is the same as the peak dopant concentration (at $D_0$) and is approximately 1.2 microns as illustrated in FIG. 14. Thus, the thickness of the charge pocket is $D_1$-$D_0$ and is approximately 1.6 microns. When the combined thickness of the lower and upper semiconductor layers 1242 and 1244 is 13.9 microns, $D_2$ is where the doping concentration is the same as the peak dopant concentration (at $D_0$) and is approximately 2.1 microns as illustrated in FIG. 14. Thus, the thickness of the charge pocket is $D_2$-$D_0$ and is approximately 2.5 microns.

Figure 15:
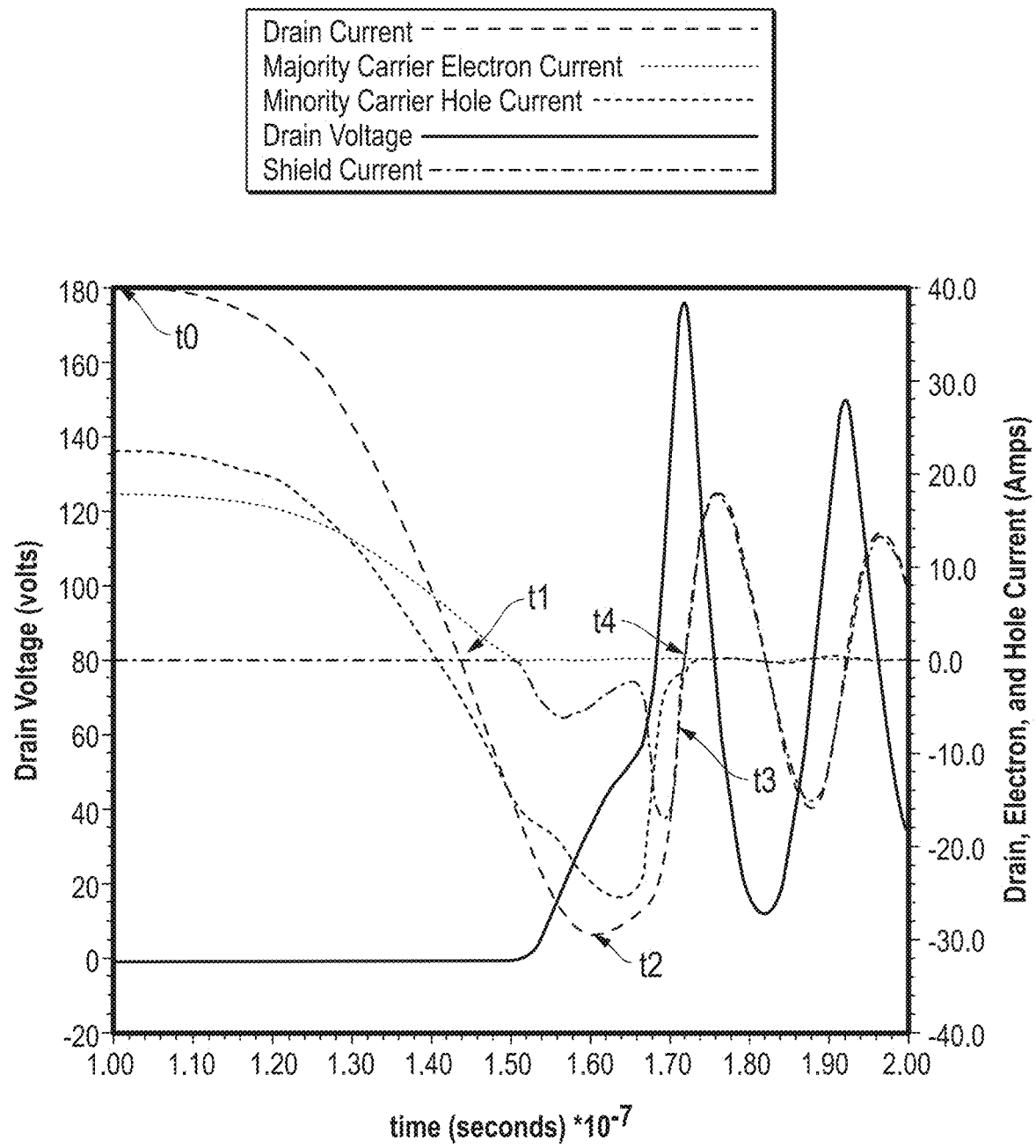
FIG. 15 includes plots for an electrical field and doping profiles a transistor structure without a doped region along a centerline of a mesa.
Figure 16:
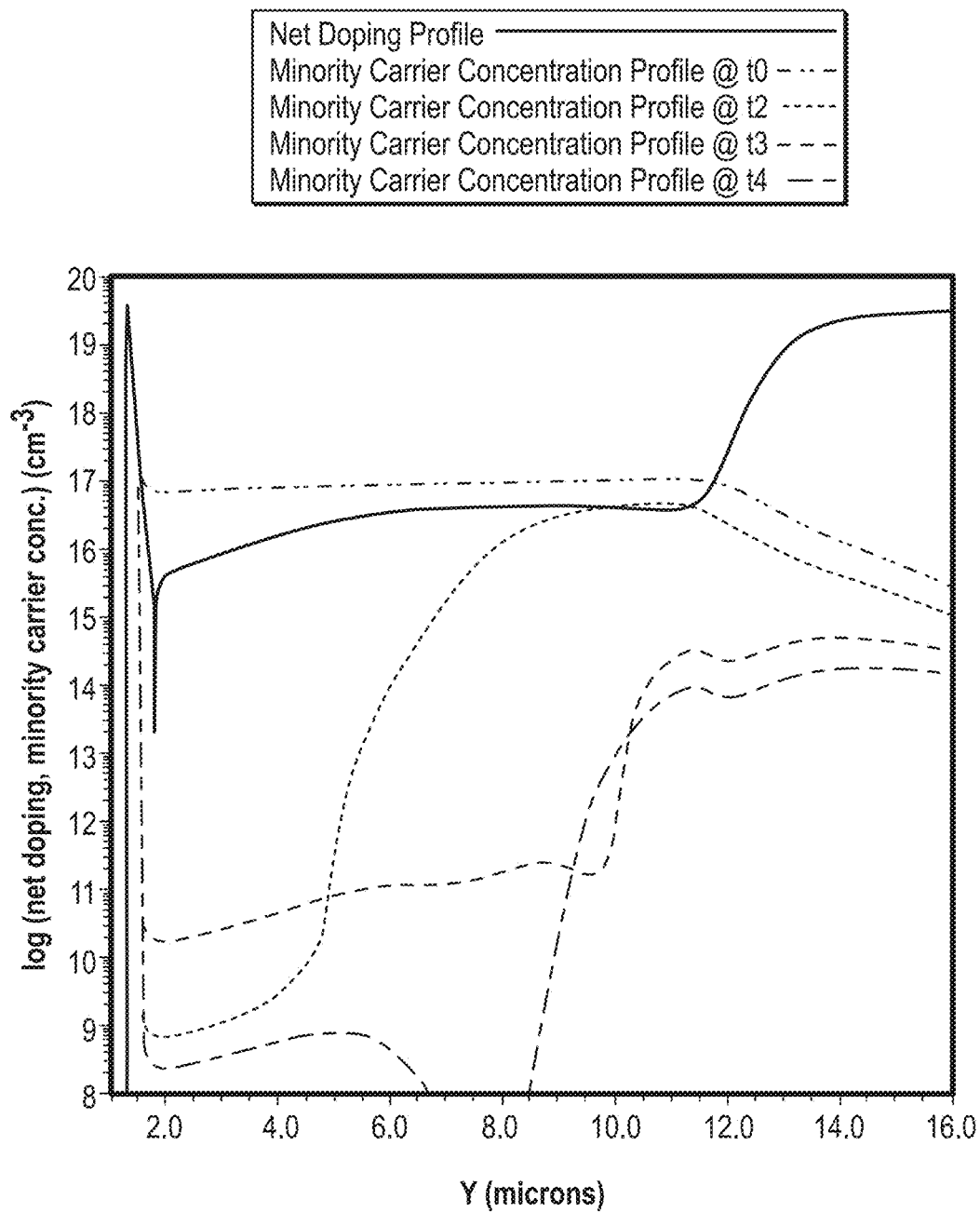
FIG. 16 includes plots for an electrical field and doping profiles for a transistor structure having a doped region along a centerline of a mesa.
Figure 17:
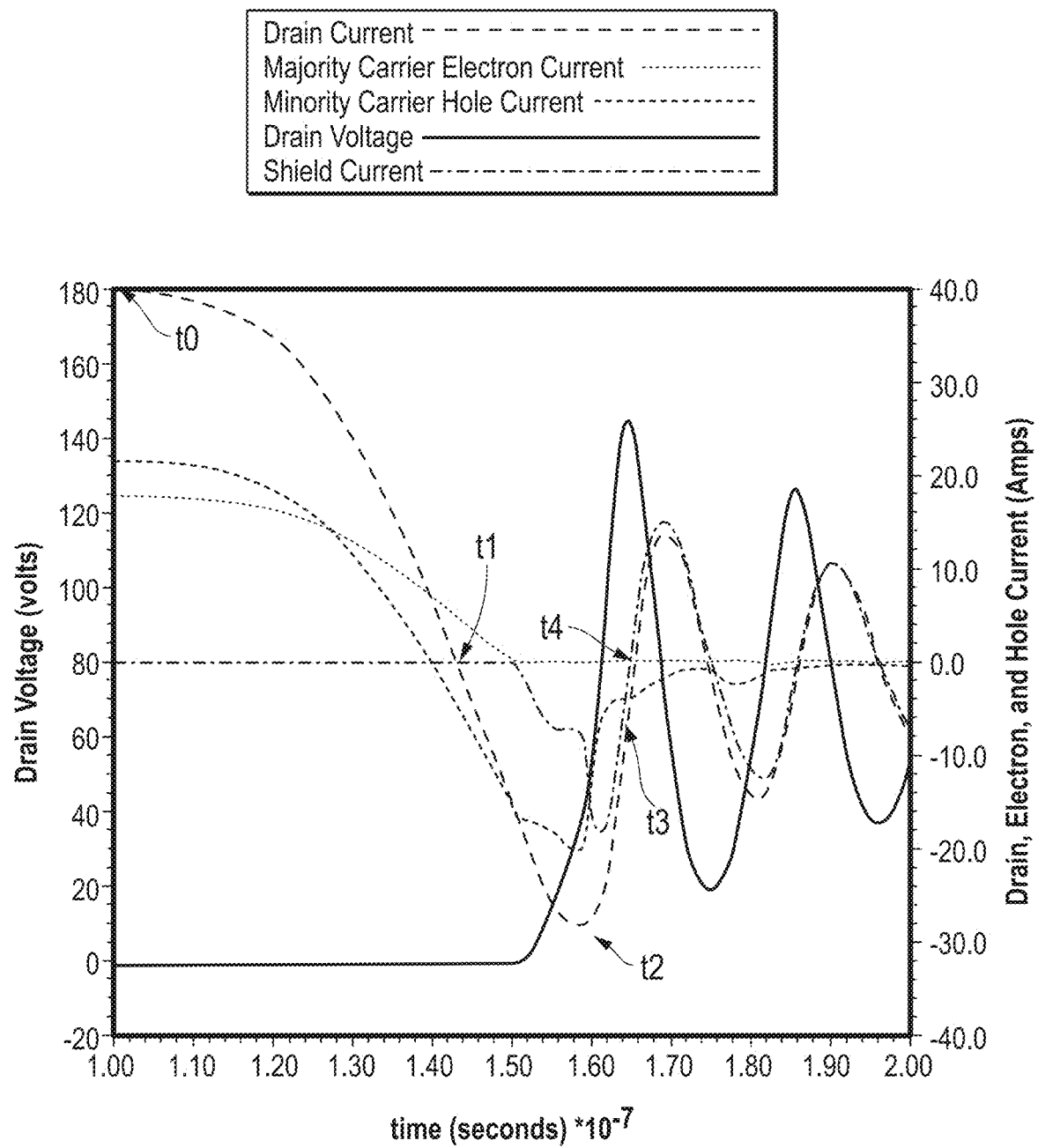
FIG. 17 includes plots of drain voltage and various currents as a function of time for an electronic device that does not include a doped region at the bottoms of the trenches.
Figure 18:
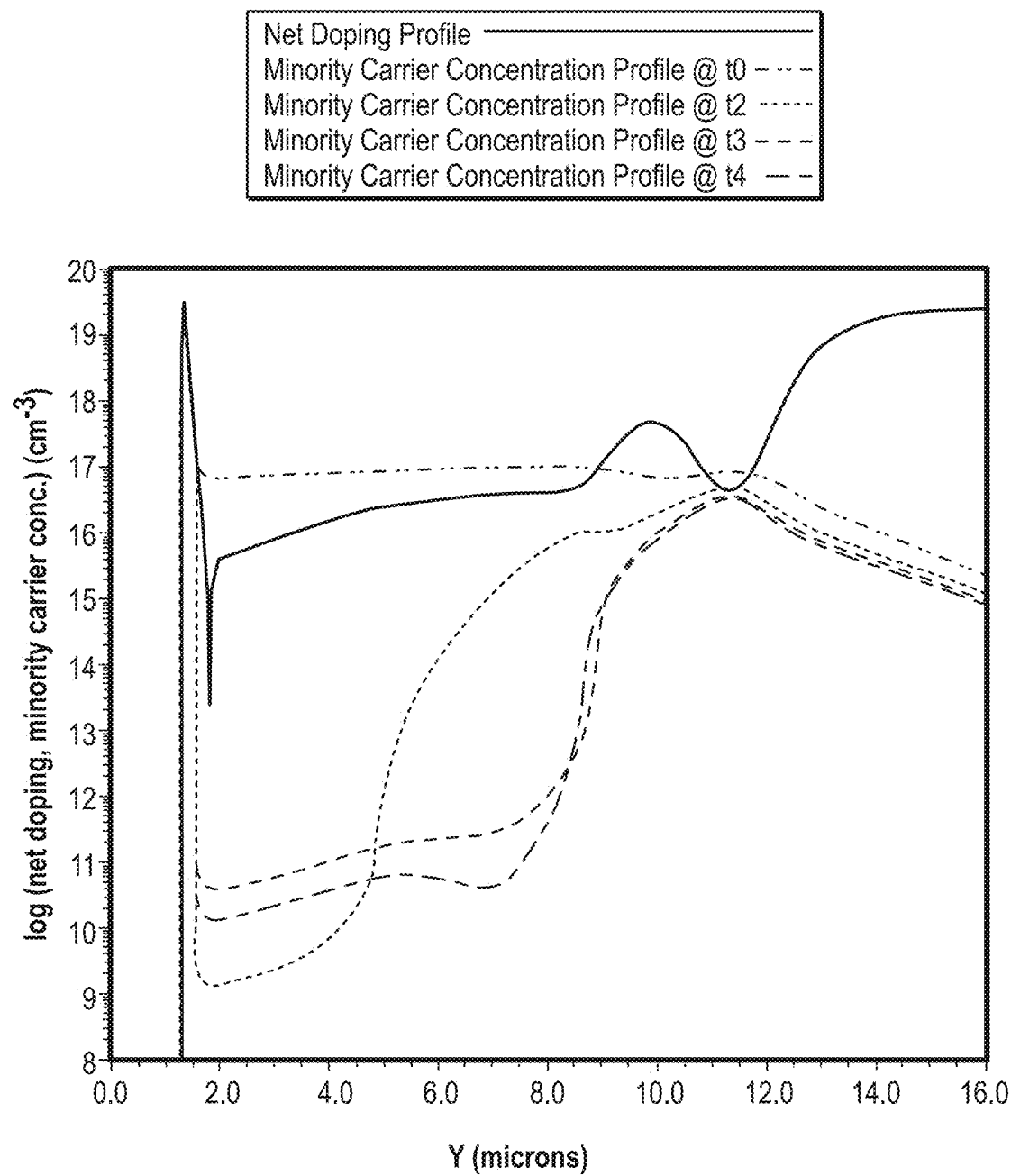
FIG. 18 includes plots of net doping profile and minority carrier concentrations at different times as a function of depth for an electronic device that does not include a doped region at the bottoms of the trenches.

FIG. 15 represents the diode recovery waveform at 40 amps, 2400 amps/μsec, and FIG. 16 represents the net doping profile and minority carrier concentration profiles along the vertical centerline 1040 for a transistor structure with 4.05 microns of the lower semiconductor layer 1242 below the lowermost point 2426 of the trench 242 without the implant that would otherwise form the doped region 524 and the charge pockets 834 as illustrated in FIG. 10. Similarly, FIG. 17 represents the diode recovery waveform at 40 amps, 2400 amps/μsec, and FIG. 18 represents the net doping profile and minority carrier concentration profiles along the vertical centerline 1040 for a transistor structure with 4.05 microns of the lower semiconductor layer 1242 between the lowermost point 2426 of the trench 242 and upper surface 1220 of the substrate 122 with the implant in the trench bottom to forming the doped region 524 and the charge pockets 834 as illustrated in FIG. 10. The performance attributes for these structures are compared in FIGS. 19 thru 22. FIGS. 19 thru 22 clearly show the performance improvement between these two transistor structures for $R_{DSON}$, $Q_{RR}$, and $V_{DSPK}$.

Referring to FIG. 16, there is no barrier formed for the removal of minority carriers by the expansion of the space charge region during reverse recovery voltage rise as compared to the doping profile in FIG. 18. During forward bias body diode conduction at time t0 in FIG. 15, minority carriers are injected into the drift region in the mesa 222 to the substrate 122 creating a minority carrier concentration profile at t0 in FIG. 16. When the transistor structure goes through diode reverse recovery between time t1 and t4, these minority carriers recombine and are removed by the expansion of the space charge region during the reverse recovery Drain Voltage rise. Contributing to the to Drain Current in FIGS. 15 and 17. During reverse recovery between t1 and t4 in FIG. 15 and FIG. 17, the Drain Current≈(Shield Displacement Current)+(Minority Carrier Hole Current)+(Majority Carrier Electron current). For the transistor structure represented by FIGS. 15 and 16, there is no doped region 524 shown in FIG. 10 or 1424 shown in FIG. 12 to stop the expansion of the space charge region. In FIG. 16 the transistor during times t3 25% of peak reverse recovery current (Irrm) and t4 0% Irrm, the peak carrier concentration between the primary surface 1240 and the upper surface 1220 of the substrate 122 has dropped by two orders of magnitude from the t1 peak Irrm value. A low concentration of minority carriers is left to recombine to cause any significant reduction in the Drain Current ∂i/∂t during t3 and t4. This results in the high ($V_{DSPK}$) shown in FIG. 15.

Referring to FIG. 18, a barrier is formed for the removal of minority carriers by the expansion of the space charge region during reverse recovery voltage rise as compared to the doping profile in FIG. 16. During forward bias body diode conduction at time t0 in FIG. 17 minority carriers are injected into the drift region in the mesa 222 to the substrate 122 creating a minority carrier concentration profile to t0 in FIG. 18. When the transistor structure represented by FIG. 17 goes through diode reverse recovery between time t1 and t4, these minority carriers become trapped in the charge pockets 834 in FIG. 10 or 1434 in FIG. 12 because the expansion of the space charge region is prevented beyond the doped region 524 shown in FIG. 10 or 1424 shown in FIG. 12. The minority carriers become trapped in the charge pockets 834 between $D_0$ and $D_1$ or in the charge pocket 1434 between $D_0$ and $D_2$ in FIG. 14 and can only be removed by minority carrier recombination. As shown in FIG. 18, the transistor is configured such that during diode reverse recovery when time t3, which is 25% of peak reverse recovery current (Irrm), is reached in FIG. 18 at least 10% or greater of minority carriers at time t2 Irrm remain in the charge pockets 834 in FIG. 10 or 1434 in FIG. 12 to recombine with majority charge carriers. The level of the minority carriers in the charge pocket is determined by the carrier injection level, dopant level of region 524 or 1424, doping profile of the charge pockets 834 or the charge pocket 1434, and minority carrier lifetime of the pocket region. The width of the charge pockets 834 or the charge pocket 1434 sets the minority carrier charge trapped in the pocket. When minority carriers are within the charge pockets 834 or the charge pocket 1434 during the transient time period t3 25% Irrm and 0% Irrm t4 in FIG. 18, the minority charge carriers can only be removed by carrier recombination within the charge pockets 834 or the charge pocket 1434. In an embodiment, at time t3 at least 90% of the minority charge carriers in the charge pockets 834 or the charge pocket 1434 at time t2 remain to recombine with majority charge carriers. In a particular embodiment, at least 99% or all the minority charge carriers recombine with majority charge carriers within the charge pockets 834 in FIG. 10 or the charge pocket 1434 in FIG. 12. Slow recombination of minority carriers results in a slow rate of hole current ∂i/∂t shown by minority carrier hole current between t3 25% Irrm and t4 0% Irrm in FIG. 17. During this time, the hole current becomes an increasing percentage of the Drain Current reducing the Drain Current ∂i/∂t between t3 and t4 and drain voltage overshoot decreases in FIG. 17 as compared to the transistor structure without (1) the charge pockets 834 in FIG. 10 or the charge pocket 1434 in FIGS. 12 and (2) the doped region 524 in FIG. 10 or the doped region 1424 in FIG. 12.

Figure 19:
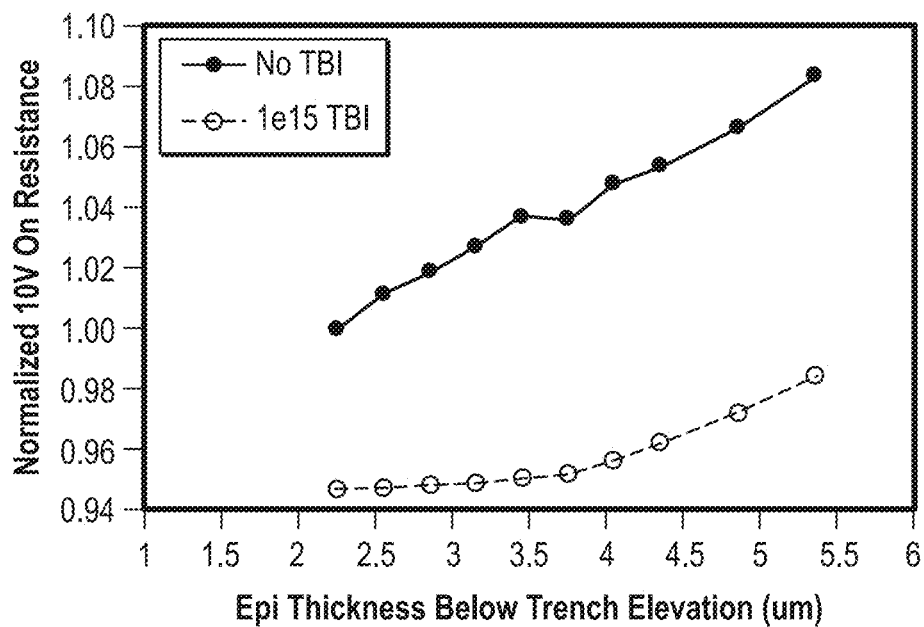
FIG. 19 includes plots of drain voltage and various currents as a function of time for an electronic device that includes a doped region at the bottoms of the trenches.

FIG. 19 includes a plot of normalized On Resistance as a function of the thickness of the lower semiconductor layer 1242 or 1442 between the lowermost points 2426 of the trenches 242 and the upper surface 1220 of the substrate 122. The plots include a transistor structure without the doped regions 524 and 1424 (No TBI) and a transistor structure with the doped region 524 or 1424 (1e15 TBI). A transistor structure with the doped region 524 or 1424 has significantly lower On Resistance ($R_{DSON}$). Thus, $R_{DSON}$ is in a range of 5% to 10% lower for the transistor structure having the doped region 524 or 1424, as compared to an identical transistor structure except without the doped region 524 or 1424.

Figure 20:
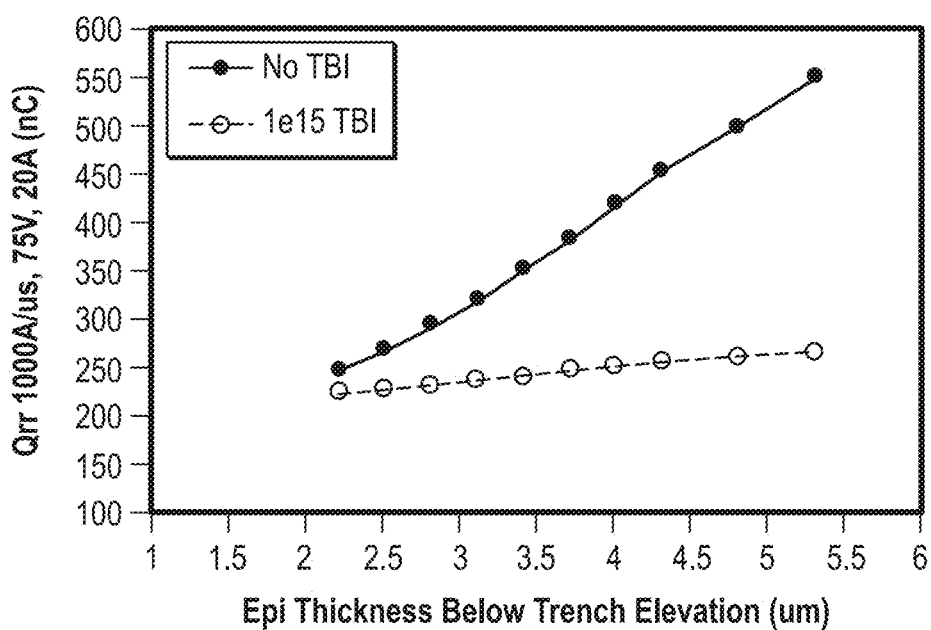
FIG. 20 includes plots of net doping profile and minority carrier concentrations at different times as a function of depth for an electronic device that includes a doped region at the bottoms of the trenches.

FIG. 20 includes a plot of $Q_{RR}$ as a function of the thickness of the lower semiconductor layer 1242 between the lowermost points 2426 of the trenches 242 and the upper surface 1220 of the substrate 122. Such thickness corresponds to the dimension 2428 as illustrated in FIG. 2. $Q_{RR}$ is related to energy lost during a switching operation of a transistor structure, where greater $Q_{RR}$ results in greater energy loss. The plots include a transistor structure without the doped regions 524 and 1424 (No TBI) and a transistor structure with the doped region 524 or 1424 (1e15 TBI). $Q_{RR}$ for transistor structure without doped region 524 increases by approximately 130% as the thickness of the lower semiconductor layer 1242 under the trenches 242 is increased from 2.2 microns to 5.4 microns. For the transistor structure with the doped region 524, $Q_{RR}$ increases at a substantially lower rate as the thickness of the lower semiconductor layer 1242 increases from 2.2 microns to 5.4 microns. In an embodiment, $Q_{RR}$ increases by less than 20% between thicknesses of 2.2 microns to 5.4 microns for the transistor structure with the doped region 524. Thus, energy loss due to switching is significantly reduced.

Figure 21:
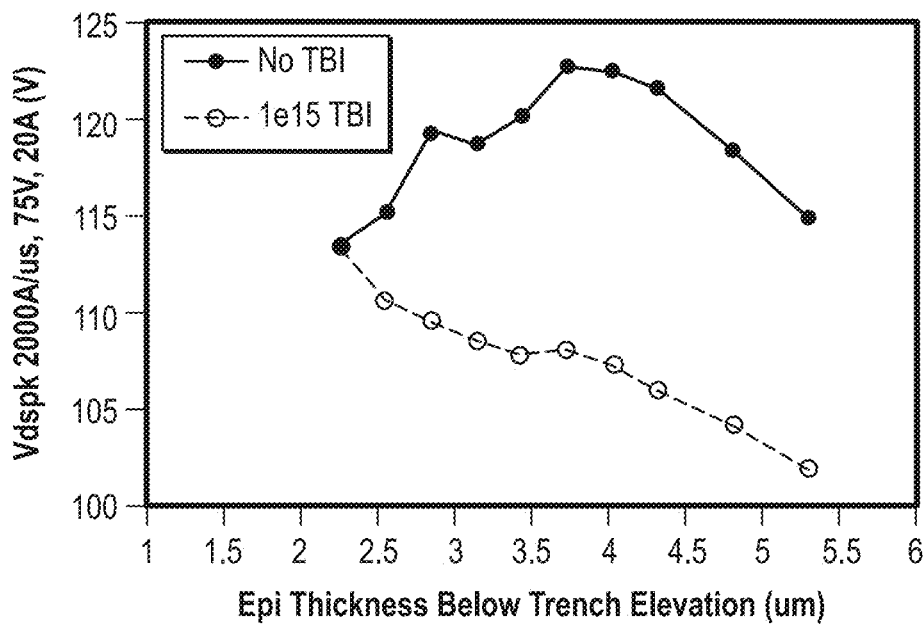
FIG. 21 includes plots for normalized on-state resistance as a function of the thickness of the semiconductor layer as a function of epi thickness.
Figure 22:
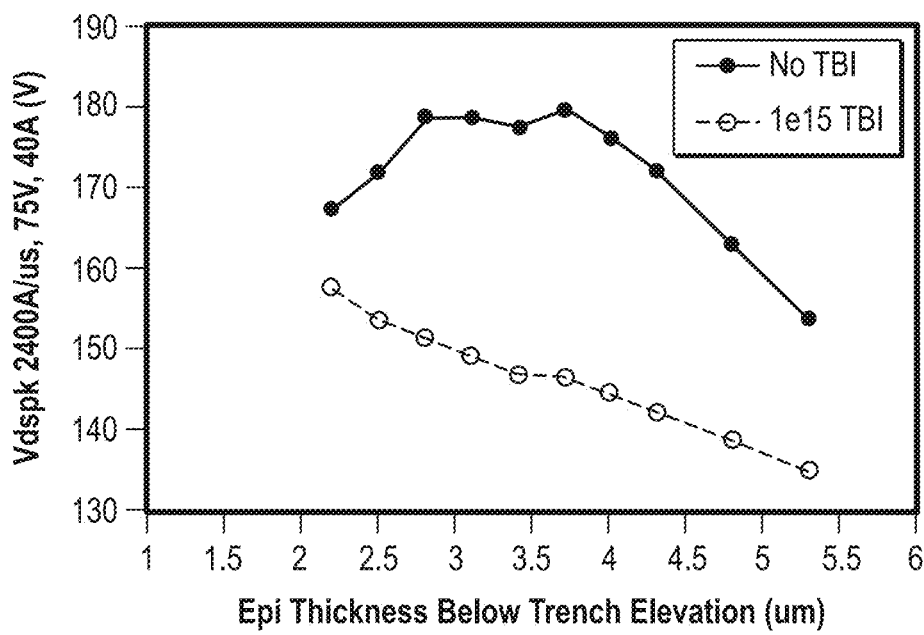
FIG. 22 includes plots of reverse recovery charge as a function of epi thickness.

FIGS. 21 and 22 include plots $V_{DSPK}$ as a function of the thickness of the lower semiconductor layer 1242 between the lowermost points 2426 of the trenches 242 and the upper surface 1220 of the substrate 122. Such thickness corresponds to the dimension 2428 in FIG. 2. The plots in each of FIGS. 21 and 22 include a transistor structure without the doped regions 524 and 1424 and the charge pockets 834 and 1434 (No TBI) and a transistor structure with the doped region 524 and the charge pockets 834 (in FIG. 10) or the doped region 1424 and the charge pocket 1434 (in FIG. 12) (1e15 TBI). For these plots, the transistor structures have a rated $BV_{DSS}$ of 150 V.

For FIGS. 21 and 22, $V_{DS}$ is 75 V, and the transistor structures are at a current flow of 20 A (FIG. 21) and 40 A (FIG. 22) in diode forward conduction just prior to reverse recovery of the transistors. The transistors go through diode reverse recovery and $V_{DSPK}$ was obtained during the transient time period between t1 and t4 represented in FIGS. 15 and 17.

Referring to FIG. 17, at the thickness of 2.5 microns or greater (thickness of the lower semiconductor layer 1242 between the lowermost points 2426 of the trenches 242 and the substrate 122, which corresponds to dimension 2428 in FIG. 2), the charge pockets 834 are formed or the charge pocket 1434 is formed, and $V_{DSPK}$ for the transistor structure with the charge pockets 834 or the charge pocket 1434 is significantly lower than $V_{DSPK}$ for the transistor structure without the charge pocket(s). FIG. 22 shows a similar improvement in $V_{DSPK}$ for the transistor structure with the charge pockets 834 or the charge pocket 1434 as compared to the transistor structure without the charge pocket(s).

Figure 23:
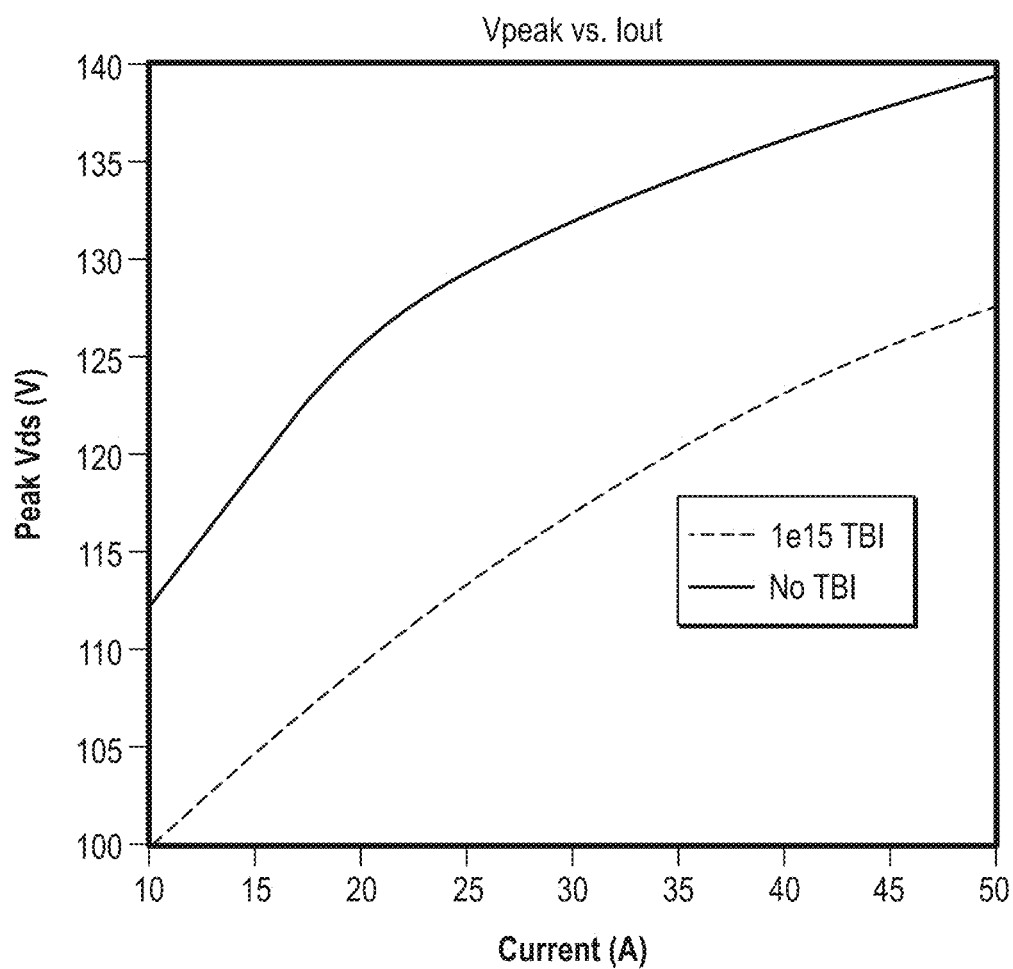
FIG. 23 includes plots of peak overshoot drain-to-source voltage as a function of epi thickness after turning off the corresponding transistors operating at 20 A current.

FIG. 23 has plots of $V_{DSPK}$ as a function of drain current ($I_D$) during diode recovery of the transistors having transistor structures as illustrated in FIG. 10 in an actual DC-to-DC Synchronous Buck converter circuit. Similar to $V_{DSPK}$ in FIGS. 21 and 22, $V_{DSPK}$ is obtained during the transient time period between t1 and t4 during diode reverse recovery shown in FIGS. 15 and 17 for the transistor. For $I_p$ between 10 A and 50 A, the transistor structure without charge pockets 834 and 1434 (No TBI) has a $V_{DSPK}$ that is in a range from 10% to 15% higher than $V_{DSPK}$ for the transistor structure with the charge pockets 834 or the charge pocket 1434.

The transistor structure with the charge pockets 834 or the charge pocket 1434 has a significantly lower $V_{DSPK}$ as compared to the transistor structure without the charge pockets 834 and 1434. Thus, as compared to the transistor structure with charge pockets 834 or the charge pocket 1434, the transistor structure without the charge pockets 834 and 1434 is more likely to experience excessive peak voltage overshoot that may exceed BVDss for the transistor structure and cause damage to the transistor structure or to another component coupled to the transistor structure.

As seen with FIGS. 14 and 17 to 23, a transistor structure including the doped region 524 and charge pockets 834 or the doped region 1424 and the charge pocket 1434 has a good combination of lower $R_{DSON}$ and $Q_{RR}$, with less likelihood of reaching or exceeding $BV_{DSS}$ during diode reverse recovery operation, and less energy loss associated with $Q_{RR}$, as compared to transistor structures without the doped regions 524 and 1424 and the charge pockets 834 and 1434.

Figure 24:
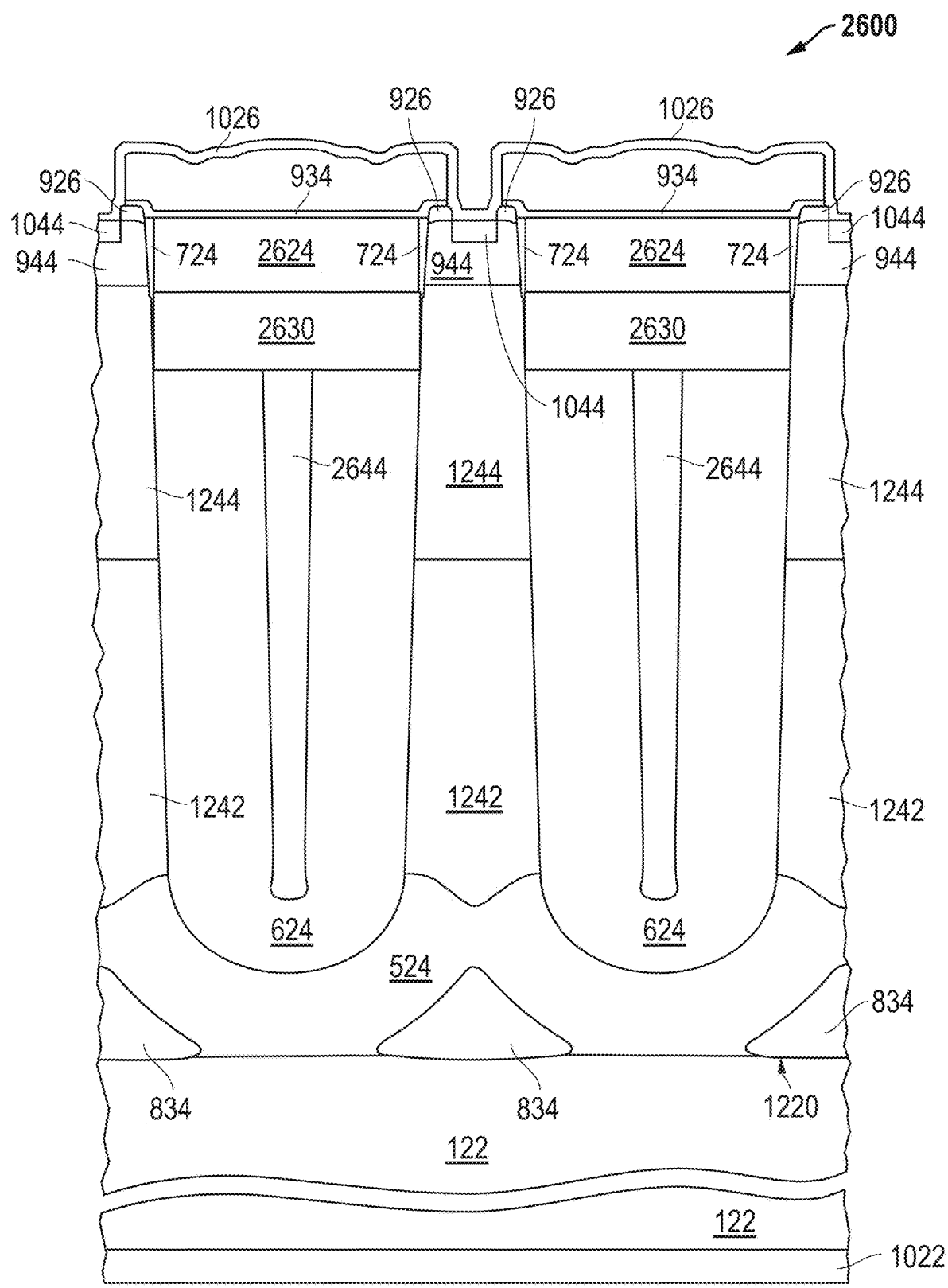
FIG. 24 includes plots of peak overshoot drain-to-source voltage as a function of epi thickness after turning off the corresponding transistors operating at 40 A current.

FIG. 24 includes an illustration of an alternative embodiment in which a workpiece 2600 includes gate electrodes are stacked over shield electrodes. Processing as previously described with respect to FIGS. 1 to 6 can be performed, except the conductive layer for shield electrodes 644 in FIG. 6 extends over the insulating layer 624 within and outside the trenches 242. Both the insulating layer 624 and the conductive layer are recessed within the trenches 242. Shield electrodes 2644 are formed within the trenches 242. An insulating layer 2630 is formed within the trenches to isolate the shield electrodes 2644 from the gate electrodes 2624. The insulating layer 2630 can include one or more films of an oxide, a nitride, or an oxynitride. The insulating layer 2630 has a thickness in a range of 20 nm to 300 nm. After forming the gate dielectric layer 724, gate electrodes 2624 and insulating layer 934 formed. The gate electrodes 2624 can include any material and be formed using any of the techniques previously described with respect to the gate electrodes 824. Further processing as illustrated and described with respect to FIGS. 9 and 10 can be performed to form a substantially completed electronic device.

In another embodiment, the lower semiconductor layer 1242 can be replaced by two or three monocrystalline semiconductor films. In an embodiment, a semiconductor film can be epitaxially grown from the substrate and be doped with a dopant and at a dopant concentration as previously described with respect to the doped regions 524, and another semiconductor film can be epitaxially grown from the doped semiconductor film to form a lower semiconductor layer having a thickness are previously described with respect to the lower semiconductor layer 1242.

In another embodiment, a first semiconductor film can be grown from the substrate 122 and may be undoped or have a dopant concentration lower than the peak doping define at point $D_0$ similar to FIG. 16. A second semiconductor film can be grown from the first semiconductor film and have a dopant and dopant concentration as previously described with respect to the doped region 524. A third semiconductor film can be grown from the second semiconductor film and may be undoped or have a dopant concentration up to the background dopant concentration previously described with respect to the lower semiconductor layer 1242. Referring to FIG. 12, the first semiconductor film corresponds to the portion of the lower semiconductor layer 1442 below the doped region 1424, the thickness of the second semiconductor film corresponds to the doped region 1442, and the third semiconductor film corresponds to the portion of the lower semiconductor layer 1442 between the doped region 1424 and the upper semiconductor layer 1244. The combined thickness of the first, second, and third semiconductor films can be any of the thicknesses as previously described with respect to the lower semiconductor layer 1242.

In another embodiment, a first semiconductor film can be grown from the substrate 122 and may be undoped or have a dopant concentration up to the background dopant concentration previously described with respect to the lower semiconductor layer 1242. An As or Sb implant can be made to achieve the desired doping of region 1424 before a second semiconductor film is grown from the first semiconductor film and have a dopant and dopant concentration as previously described with respect to region 1442. A third semiconductor film can be grown from the second semiconductor film and may be undoped or have a dopant concentration up to the background dopant concentration previously described with respect to the lower semiconductor layer 1242.

Referring to FIG. 12, the first semiconductor film corresponds to the portion of the lower semiconductor layer 1434 below the doped region 1424, the implant portion of the first semiconductor film corresponds to the doped region 1424, and the second semiconductor film corresponds to the portion of the lower semiconductor layer 1442 between the doped region 1424 and the upper semiconductor layer 1244. The combined thickness of the first, second, and third semiconductor films can be any of the thicknesses as previously described with respect to the lower semiconductor layer 1242.

For embodiments described in the prior two paragraphs, the semiconductor films are patterned to define the trenches after doping is performed or after forming the more heavily doped semiconductor film. The trenches extend to the higher doped region or is sufficiently close enough that dopant can diffuse to the bottoms of the trenches during subsequent thermal processing.

In the embodiments previously described, the substrate 122, the lower semiconductor layer 1242, the doped region 524, and source regions 926 can be n-type doped and the body regions 944 and the body contact regions 1044 are p-type doped. In other embodiments, any of the previously described embodiments may have conductivity types reversed. Thus, the substrate 122, the lower semiconductor layer 1242, the doped region 524, and source regions 926 are p-type doped and the body regions 944 and the body contact regions 1044 are n-type doped. The conductivity types for the transistor structures in FIG. 12 and the other embodiments having semiconductor films epitaxially grown to form the lower semiconductor layer can have their conductivity types reversed.

A power transistor may incorporate charge traps at a density sufficient to reduce the minority carrier lifetime in portions of the mesas 222 above the doped region 524 or 1424 (FIGS. 10 and 12) to reduce $Q_{RR}$ without impact to the minority carrier recombination rate within the charge pockets 834 (FIG. 14) between the doped region 524 (FIGS. 10 and 12) and the substrate 122 (FIG. 10) or the minority carrier recombination rate within the charge pocket 1434 between the doped region 1424 and the substrate 122 (FIG. 14). Similarly charge traps can be introduced into the charge pocket(s) only to optimize the trade-off between $Q_{RR}$ and $V_{DSPK}$. Additionally charge traps can be introduced in both portions of mesas above the doped region 524 or 1424 and the charge pocket formed in portions of the lower semiconductor layer 1242 below doped region 524 (FIG. 10) or the portion of the lower semiconductor layer 1442 below the doped region 1424 (FIG. 12) to reduce $Q_{RR}$ and optimize $Q_{RR}$ and $V_{DSPK}$ trade-off. The traps can be introduced by doping with Au, Pt, Pd, or another mid-band dopant (at least 0.3 eV from the conduction and valence bands) or irradiating transistor structures with electrons, Helium (He), or protons ($H^+$). The techniques to reduce minority carrier lifetime described in this paragraph are conventional. The use of the doped region 524 or the doped region 1424 does not significantly adversely affect the minority carrier lifetime when using the lifetime reduction techniques described in this paragraph. A lifetime reduction technique may or may not be used with the transistor structures described herein.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1. An electronic device can include a substrate including a first dopant having a first conductivity type; a semiconductor layer including a second dopant having the first conductivity type, wherein the semiconductor layer overlies the substrate and includes a mesa that is disposed immediately adjacent to a trench, the trench has a lowermost point along a bottom of the trench; an active region of a transistor structure is disposed within the mesa; a shield electrode within the trench; and a doped region within the semiconductor layer. The doped region extends across an entire width of the mesa and contacts the lowermost point of the trench, the doped region includes a third dopant having the first conductivity type, and along a vertical centerline of the mesa, an elevation of a peak dopant concentration of the third dopant within the doped region is between an elevation of the lowermost point of the trench and an elevation of an upper surface of the substrate.

Embodiment 2. The electronic device of Embodiment 1, wherein the third dopant is As or Sb.

Embodiment 3. The electronic device of Embodiment 1, wherein the peak dopant concentration of the third dopant within the doped region is in a range from $5 \times 10^{16}$ atoms/cm$^3$ to $5 \times 10^{18}$ atoms/cm$^3$.

Embodiment 4. The electronic device of Embodiment 1, wherein the first dopant is As or Sb.

Embodiment 5. The electronic device of Embodiment 1, wherein, at an elevation between the elevation of the peak dopant concentration of the doped region and the elevation of the upper surface of the substrate at a location closest to the mesa, the semiconductor layer has a minimum dopant concentration, wherein the peak dopant concentration is in a range from 1.1 to 250 times higher than the minimum dopant concentration.

Embodiment 6. The electronic device of Embodiment 5, wherein the minimum dopant concentration is greater than a background dopant concentration of the second dopant within the semiconductor layer.

Embodiment 7. The electronic device of Embodiment 1 further includes an insulating layer disposed along the bottom and a part, and not all, of a sidewall of the trench; a gate dielectric layer disposed along a different part of the sidewall of the trench; a gate electrode being within the trench and adjacent to the gate dielectric layer; a body region being within the mesa and adjacent to the gate electrode, wherein the body region has a second conductivity type opposite the first conductivity type; and a source region being within the mesa and overlying the body region.

Embodiment 8. An electronic device can include a substrate; a semiconductor layer overlying the substrate, wherein the semiconductor layer includes a mesa that is disposed adjacent to a trench, the trench has a lowermost point along a bottom of the trench; an active region of a transistor structure within the mesa; a shield electrode within the trench; and a charge pocket, wherein at least a majority of the charge pocket lies at an elevation below an elevation of the lowermost point of the trench, wherein the charge pocket is configured to allow minority charge carriers to recombine with majority charge carriers.

Embodiment 9. The electronic device of Embodiment 8, wherein the transistor structure includes the substrate, the semiconductor layer, the active region, the shield electrode, and the charge pocket, wherein the active region includes a body diode, and the transistor structure is configured such that during a body diode recovery between a peak reverse recovery current and 25% of the peak reverse recovery current during a tb portion of the body diode recovery and during charge blocking, at least 10% of minority carriers at the peak reverse recovery current remain in the charge pocket and recombine with majority charge carriers.

Embodiment 10. The electronic device of Embodiment 9, wherein the transistor structure does not include a minority charge carrier lifetime reduction trap, the transistor structure has a drain-to-source breakdown voltage, and the transistor structure is configured such that during a transient time period of a body diode recovery after a body diode forward bias current level is operating at a current density greater than of 50 A/cm², the transistor structure has a peak drain-to-source voltage that is at most 90% of the drain-to-source breakdown voltage.

Embodiment 11. The electronic device of Embodiment 8 further includes charge traps at a density sufficient to reduce minority carrier lifetime in a portion of the mesa above a doped region that extends across an entire width of the mesa and contacts the lowermost point of the trench.

Embodiment 12. The electronic device of Embodiment 8 further includes charge traps at a density sufficient to reduce minority carrier lifetime in a portion of the charge pocket below a doped region that extends across an entire width of the mesa.

Embodiment 13. The electronic device of Embodiment 8 further includes a doped region overlying and immediately adjacent to the charge pocket, wherein the substrate, the semiconductor layer, and the doped region have a same conductivity type, and the doped region includes a dopant at a dopant concentration in a range from $1 \times 10^{16}$ atoms/cm³ to $1 \times 10^{18}$ atoms/cm³.

Embodiment 14. The electronic device of Embodiment 8 further includes an insulating layer along the bottom and a part, and not all, of a sidewall of the trench; a gate dielectric layer along a different part of the sidewall of the trench; a gate electrode being within the trench and adjacent to the gate dielectric layer; a body region being within the mesa and adjacent to the gate electrode, wherein the charge pocket has a first conductivity type, and the body region has a second conductivity type opposite the first conductivity type; and a source region being within the mesa and overlying the body region.

Embodiment 15. A process can include patterning a semiconductor layer to define a trench extending partly, and not completely, through a thickness of the semiconductor layer, wherein the semiconductor layer overlies a substrate, the semiconductor layer and the substrate have a first conductivity type, and the semiconductor layer includes a mesa adjacent to the trench. The process can further include forming a sacrificial layer within the trench; removing the sacrificial layer from a bottom of the trench, wherein a remaining portion of the sacrificial layer is along a sidewall of the trench; and doping a portion of the semiconductor layer that is along the bottom of the trench, wherein doping is performed with a dopant having the first conductivity type, and doping is performed while the remaining portion of the sacrificial layer is along a sidewall of the trench.

Embodiment 16. The process of Embodiment 15, wherein doping the portion of the semiconductor layer is performed using ion implantation at no tilt angle or at a tilt angle no greater than 1° from a vertical direction.

Embodiment 17. The process of Embodiment 15, wherein doping the portion of the semiconductor layer including implanting the dopant at a dose in a range from $5 \times 10^{14}$ ions/cm² to $5 \times 10^{15}$ ions/cm².

Embodiment 18. The process of Embodiment 15 further includes diffusing the dopant to form a doped region that extends across an entire width of the mesa and contacts a lowermost point of the trench, wherein after diffusing, a peak dopant concentration of doped region is not within the substrate.

Embodiment 19. The process of Embodiment 15, wherein forming the sacrificial layer includes forming a sacrificial layer to a thickness in a range from 40 nm to 200 nm.

Embodiment 20. The process of Embodiment 19, wherein removing the sacrificial layer includes anisotropically etching the sacrificial layer.

Embodiment 21. The process of Embodiment 15 further includes removing the remaining portion of the sacrificial layer; forming an insulating layer within the trench; forming a shield electrode with the trench after forming the insulating layer; recessing the insulating layer within the trench; forming a gate dielectric layer after recessing the insulating layer; forming a gate electrode within the trench; and forming a source region within the mesa and overlying a body region.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device, comprising:
a substrate including a first dopant having a first conductivity type;
a semiconductor layer including a second dopant having the first conductivity type, wherein the semiconductor layer overlies the substrate and includes a mesa that is disposed immediately adjacent to a trench, the trench has a lowermost point along a bottom of the trench;
an active region of a transistor structure is disposed within the mesa;
a shield electrode within the trench; and
a doped region within the semiconductor layer, wherein:
the doped region extends across an entire width of the mesa and contacts the lowermost point of the trench,
the doped region includes a third dopant having the first conductivity type, and along a vertical centerline of the mesa, an elevation of a peak dopant concentration of the third dopant within the doped region is between an elevation of the lowermost point of the trench and an elevation of a portion of the semiconductor layer overlying the doped region.

2. The electronic device of claim 1, wherein the third dopant is As or Sb.

3. The electronic device of claim 1, wherein the peak dopant concentration of the third dopant within the doped region is in a range from $5 \times 10^{16}$ atoms/cm$^3$ to $5 \times 10^{18}$ atoms/cm$^3$.

4. The electronic device of claim 1, wherein the first dopant is As or Sb.

5. The electronic device of claim 1, wherein:
the electronic device further comprises a charge pocket disposed between the substrate and the doped region, and
the peak dopant concentration of the doped region is in a range from 1.1 to 250 times higher than a minimum dopant concentration within the charge pocket.

6. The electronic device of claim 1, wherein
the electronic device further comprises a charge pocket disposed between the substrate and the doped region,
the semiconductor layer includes a first semiconductor layer and a second semiconductor layer overlying the first semiconductor layer, and
a minimum dopant concentration within the charge pocket is greater than a dopant concentration of the second dopant within the second semiconductor layer.

7. The electronic device of claim 1, further comprising:
an insulating layer disposed along the bottom and a part, and not all, of a sidewall of the trench;
a gate dielectric layer disposed along a different part of the sidewall of the trench;

a gate electrode being within the trench and adjacent to the gate dielectric layer;
a body region being within the mesa and adjacent to the gate electrode, wherein the body region has a second conductivity type opposite the first conductivity type; and
a source region being within the mesa and overlying the body region.

8. An electronic device, comprising:
a substrate;
a semiconductor layer overlying the substrate, wherein the semiconductor layer includes a mesa that is disposed adjacent to a trench, the trench has a lowermost point along a bottom of the trench;
an active region of a transistor structure within the mesa;
a shield electrode within the trench; and
a charge pocket, wherein at least a majority of the charge pocket lies at an elevation below an elevation of the lowermost point of the trench, wherein the charge pocket is configured to allow minority charge carriers to recombine with majority charge carriers.

9. The electronic device of claim 8, wherein:
a transistor structure includes the substrate, the semiconductor layer, the active region, the shield electrode, and the charge pocket, wherein the active region includes a body diode, and
the transistor structure is configured such that during a body diode recovery between peak reverse recovery current and 25% of the peak reverse recovery current during a tb portion of the body diode recovery and during charge blocking, at least 10% of minority carriers at the peak reverse recovery current remain in the charge pocket and recombine with at least a portion of the majority charge carriers.

10. The electronic device of claim 9, wherein:
the transistor structure does not include a minority charge carrier lifetime reduction trap,
the transistor structure has a drain-to-source breakdown voltage, and
the transistor structure is configured such that during a transient time period of the body diode recovery after a body diode forward bias current level is operating at a current density greater than of 50A/cm$^2$, the transistor structure has a peak drain-to-source voltage that is at most 90% of the drain-to-source breakdown voltage.

11. The electronic device of claim 8, further comprising charge traps at a density sufficient to reduce minority carrier lifetime in a portion of the mesa above a doped region, wherein the doped region extends across an entire width of the mesa and contacts the lowermost point of the trench.

12. The electronic device of claim 8, further comprising charge traps at a density sufficient to reduce minority carrier lifetime in a portion of the charge pocket below a doped region that extends across an entire width of the mesa.

13. The electronic device of claim 8, further comprising a doped region overlying and immediately adjacent to the charge pocket, wherein:
the substrate, the semiconductor layer, and the doped region have a same conductivity type, and
the doped region includes a dopant at a dopant concentration in a range from $1 \times 10^{16}$ atoms/cm$^3$ to $1 \times 10^{18}$ atoms/cm$^3$.

14. The electronic device of claim 8, further comprising:
an insulating layer along the bottom and a part, and not all, of a sidewall of the trench;
a gate dielectric layer along a different part of the sidewall of the trench;

a gate electrode being within the trench and adjacent to the gate dielectric layer;

a body region being within the mesa and adjacent to the gate electrode, wherein the body region has a conductivity type opposite a conductivity type of the substrate; and a source region being within the mesa and overlying the body region.

15. The electronic device of claim 8, further comprising a doped region within the semiconductor layer, wherein the substrate, the semiconductor layer, and the doped region have a same conductivity type.

16. The electronic device of claim 15, wherein the charge pocket has a bottom surface defined by the substrate and at least one other surface defined by a curved bottom surface of the doped region.

17. The electronic device of claim 16, wherein the at least one other surface comprises a first side surface and a second side surface, both of which are defined by the curved bottom surface of the doped region.

18. The electronic device of claim 16, wherein:

the doped region extends across an entire width of the mesa and contacts the lowermost point of the trench, and the charge pocket extends under the entire width of the mesa and an entire width of the trench.

19. The electronic device of claim 1, further comprising a first charge pocket disposed between the substrate and the doped region.

20. The electronic device of claim 19, further comprising a second charge pocket, wherein along a cross-sectional view, the second charge pocket does not contact the first charge pocket and is spaced apart from the first charge pocket at least a portion of the doped region.

21. The electronic device of claim 19, wherein the doped region does not contact the substrate and is spaced apart from the substrate by at least a portion of the first charge pocket.

* * * * *